(12) United States Patent
Gunji et al.

(10) Patent No.: US 12,419,164 B2
(45) Date of Patent: Sep. 16, 2025

(54) DISPLAY DEVICE

(71) Applicant: Sharp Kabushiki Kaisha, Sakai (JP)

(72) Inventors: Ryosuke Gunji, Sakai (JP); Shinsuke Saida, Sakai (JP); Shinji Ichikawa, Sakai (JP); Tohru Okabe, Sakai (JP); Akira Inoue, Yonago (JP); Yoshihiro Nakada, Yonago (JP); Hiroharu Jinmura, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 800 days.

(21) Appl. No.: 17/763,263

(22) PCT Filed: Sep. 27, 2019

(86) PCT No.: PCT/JP2019/038096
§ 371 (c)(1),
(2) Date: Mar. 24, 2022

(87) PCT Pub. No.: WO2021/059468
PCT Pub. Date: Apr. 1, 2021

(65) Prior Publication Data
US 2022/0293714 A1  Sep. 15, 2022

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 71/00* (2023.02); *H10K 77/111* (2023.02); *H10K 2102/311* (2023.02)

(58) Field of Classification Search
CPC .. G02F 1/1333; G02F 1/13338; G02F 1/1345; G02F 1/13458; G02F 1/136222; G02F 1/13606; G02F 1/136286; G02F 1/13629; G02F 1/1368; G02F 1/13452; G02F 1/13456; H10K 27/12459; H10K 27/131; H10K 29/786; H10K 59/1201; H10K 59/40; H10K 71/00; H10K 71/233; H10K 71/851; H10K 71/80; H10K 77/111; H10K 2102/311; H10K 59/131; H10K 59/1315; H10K 59/179; H10K 59/82; H01L 27/124; H01L 29/786; H01L 23/481; H01L 23/5226; H01L 23/535; H01L 2224/32105;
(Continued)

(56) References Cited

U.S. PATENT DOCUMENTS

2002/0028540 A1   3/2002  Takizawa et al.
2014/0176886 A1*  6/2014  Yoshida ............... G02F 1/1339
                                                   349/110
(Continued)

FOREIGN PATENT DOCUMENTS

JP   08-328033 A   12/1996

*Primary Examiner* — Chanh D Nguyen
*Assistant Examiner* — Aaron Midkiff
(74) *Attorney, Agent, or Firm* — Keating & Bennett, LLP

(57) ABSTRACT

Contact holes related to routed wires electrically connected to data signal lines running through the corner portions of a display region are larger in number than contact holes related to routed wires electrically connected to data signal lines running through the center portion of the display region.

20 Claims, 22 Drawing Sheets

(51) Int. Cl.
*H10K 71/00* (2023.01)
*H10K 77/10* (2023.01)
*H10K 102/00* (2023.01)

(58) Field of Classification Search
CPC ......... H01L 2224/32112; G06F 3/0412; G06F 3/044; G09F 9/30; G09G 2300/0426; G09G 2300/0408; G09G 2310/027; G09G 2310/0278; G09G 3/3266; G09G 3/3674; G09G 3/3677; G09G 2310/02–0221; G09G 2310/0267; G09G 3/3233; G09G 2310/0286; G09G 2310/0232; H10D 59/441
See application file for complete search history.

(56) References Cited

U.S. PATENT DOCUMENTS

| | | | |
|---|---|---|---|
| 2017/0338295 A1* | 11/2017 | Lee | H10K 59/873 |
| 2018/0197484 A1* | 7/2018 | Moon | G09G 3/3225 |

\* cited by examiner

DISPLAY DEVICE

TECHNICAL FIELD

The disclosure relates to a display device.

BACKGROUND ART

A known display device includes: an insulating substrate; gate bus lines extending on the insulating substrate to connect gates of thin-film transistors in common; drain bus lines extending on the insulating substrate to connect drains of the thin-film transistors in common; external terminals formed on an edge of the transparent insulating substrate, and facing the gate bus lines at one end; and other external terminals formed on an other edge of the transparent insulating substrate, and facing the drain bus lines at one end (Patent Document 1).

CITATION LIST

Patent Literature

[Patent Document 1] Japanese Unexamined Patent Publication Application No. H08-328033 (Published on Dec. 13, 1996)

SUMMARY

Technical Problem

The display device described in Patent Document 1 has a problem. When, in spin cleaning of a production step of the display device, a cleaning solution is applied to the gate bus lines and the drain bus lines provided on the insulating substrate, electrolytic corrosion could occur on contact holes provided to the long gate lines and bus lines at one end, and the contact holes might be electrically broken.

An aspect of the disclosure is to provide a display device whose wiring on a substrate is kept from an electrical break even though the substrate is sprayed with a cleaning solution in spin cleaning of a production step of the display device.

Solution to Problem

A display device according to the disclosure includes: display region; and; a frame region disposed around the display region. The frame region includes a terminal unit disposed at an end of the frame region. On a substrate disposed in the display region and the frame region, a first wire, a first interlayer insulating film, a second wire, a second interlayer insulating film, and a third wire are provided in a stated order. The display region includes: a plurality of control lines included in the first wire and extending in a first direction; a plurality of data signal lines included in the third wire and extending in a second direction orthogonal to the first direction; a plurality of pixel circuits each provided to a corresponding one of intersections of the control lines and the data signal lines; and a plurality of light-emitting elements each corresponding to one of the pixel circuits. The frame region includes a plurality of routed wires to electrically connect together the data signal lines and a plurality of terminals included in the terminal unit. The routed wires electrically connect to the data signal lines through contact holes provided to the second interlayer insulating film. The display region includes: a pair of corner portions disposed in two corners of the display region, and provided closer to the terminal unit in the first direction; and a center portion disposed between the pair of the corner portions. The routed wires include: center portion routed wires; and corner portion routed wires longer than the center portion routed wires. The corner portion routed wires are electrically connected to data signal lines included in the data signal lines and running through the corner portions of the display region. The center portion routed wires are electrically connected to data signal lines included in the data signal lines and running through the center portion of the display region. The contact holes corresponding to the corner portion routed wires are larger in number than the contact holes corresponding to the center portion routed wires.

An other display device according to the disclosure includes: a display region; and a frame region disposed around the display region. The frame region includes a terminal unit disposed at an end of the frame region. On a substrate disposed in the display region and the frame region, a first wire, a first interlayer insulating film, a second wire, a second interlayer insulating film, and a third wire are provided in a stated order. The display region includes: a plurality of control lines included in the first wire and extending in a first direction; a plurality of data signal lines extending in a second direction orthogonal to the first direction; a plurality of pixel circuits each provided to a corresponding one of intersections of the control lines and the data signal lines; and a plurality of light-emitting elements each corresponding to one of the pixel circuits. The frame region includes: a control circuit for inputting a control signal to the control lines; and a plurality of routed wires for connecting the control lines and the control circuit. The third wire includes a plurality of connection wires connecting together the control lines and the routed wires. Each of the control lines electrically connects to a corresponding one of the connection wires through a first contact hole provided to the first interlayer insulating film and the second interlayer insulating film. Each of the routed wires electrically connects to a corresponding one of the connection wires through a second contact hole provided to the second interlayer insulating film. A plurality of the second contact holes corresponding to each of the routed wire are larger in number than a plurality of the first contact holes corresponding to each of the control lines.

Advantageous Effect of Disclosure

An aspect of the disclosure can keep wiring on a substrate from an electrical break even though the substrate is sprayed with a cleaning solution in spin cleaning of a production step of the display device.

DESCRIPTION OF EMBODIMENTS

In the description below, the term "same layer" means that constituent features are formed in the same process (in the same film forming process). The term "lower layer" means that a constituent feature is formed in a previous process before a comparative layer. The term "upper layer" means that a constituent feature is formed in a successive process after a comparative layer.

First Embodiment

Figure 1:
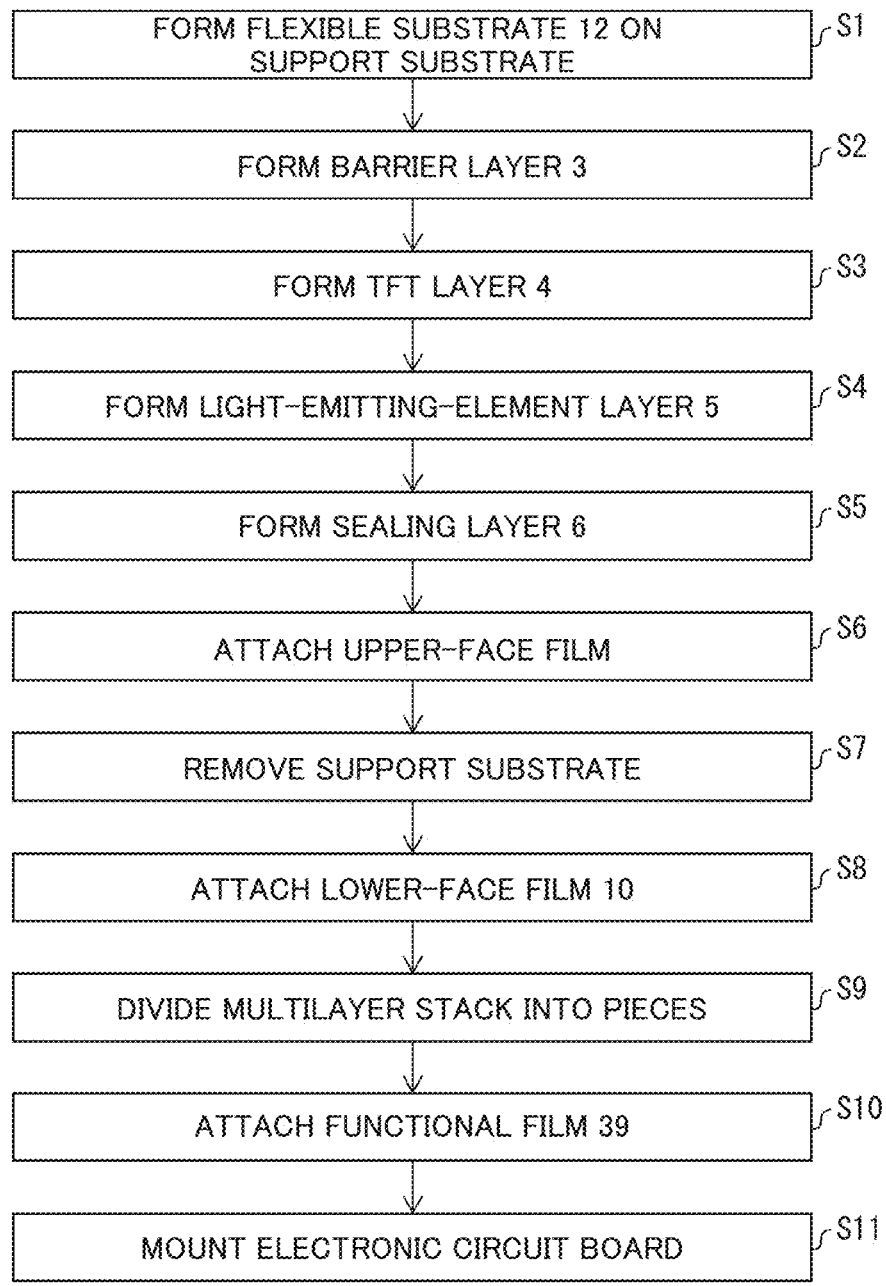
FIG. 1 is a flowchart showing an example of a method for producing a display device.
Figure 2:
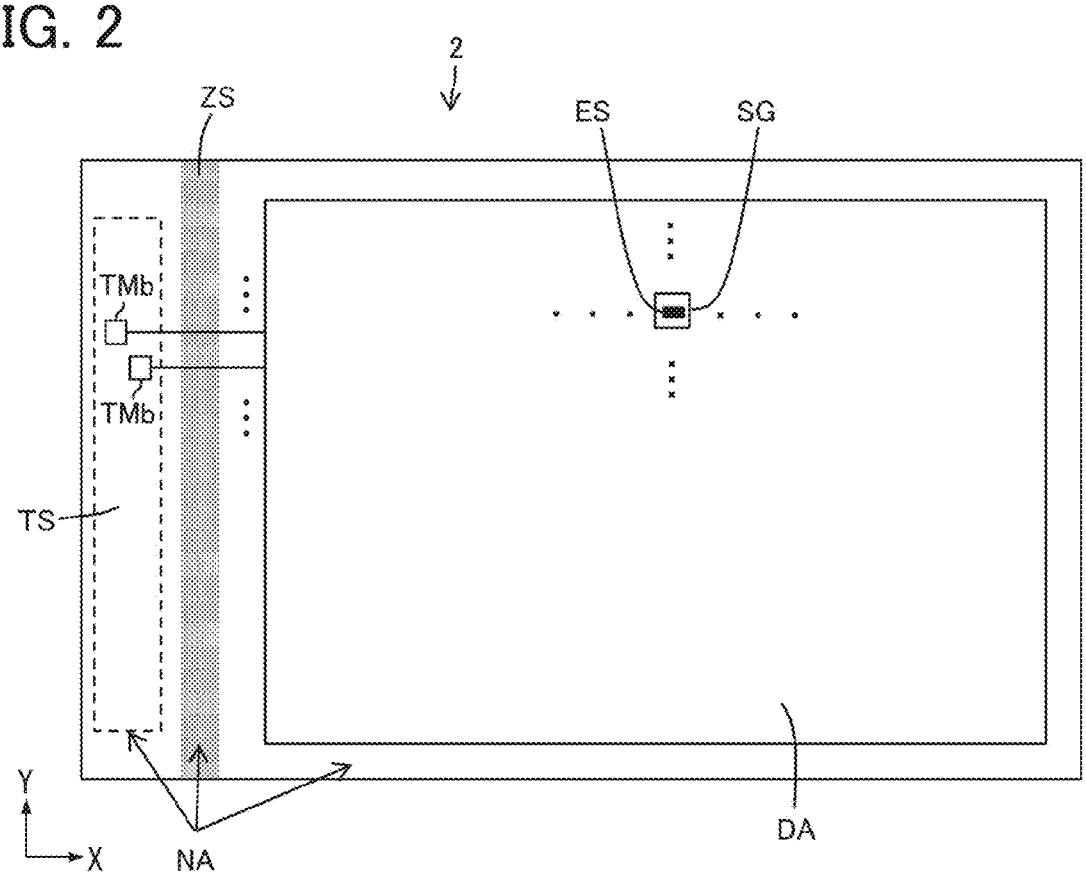
FIG. 2 is a schematic view of a configuration of the display device in plan view.
Figure 3:
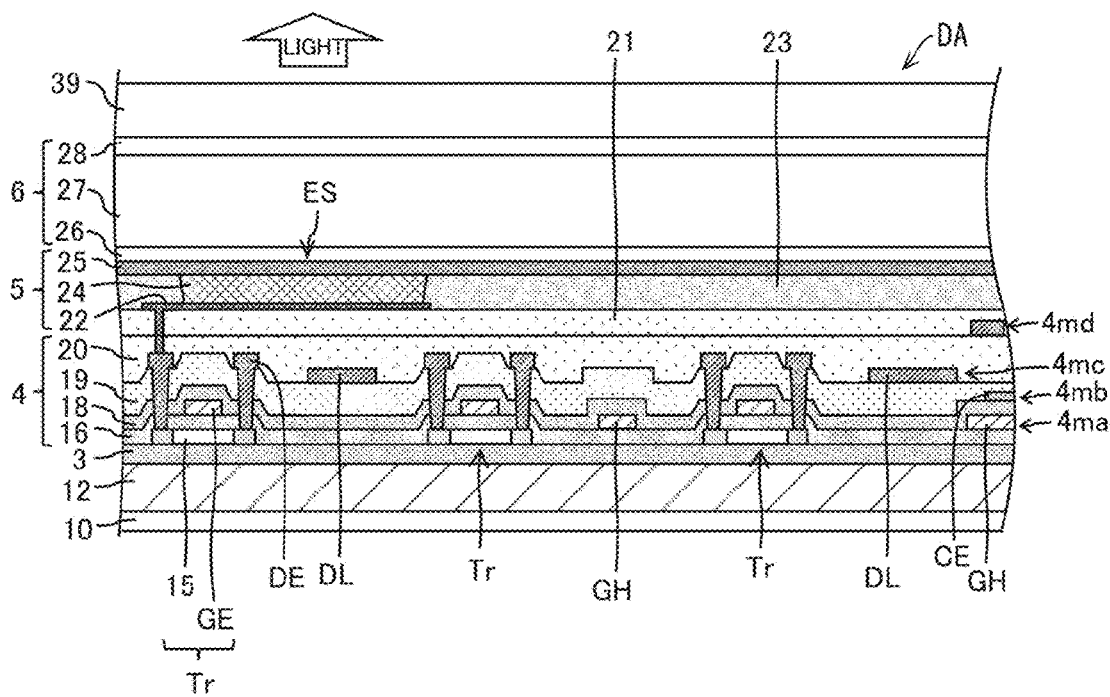
FIG. 3 is a schematic view of a configuration of a display region in cross-section.

FIG. 1 is a flowchart showing an example of a method for producing a display device 2. FIG. 2 is a schematic view of a configuration of the display device 2 in plan view. FIG. 3 is a schematic view of a configuration of a display region DA in cross-section.

In producing a flexible display device 2 as seen in FIGS. 1 to 3, first, at Step S1, a flexible substrate 12 (a resin substrate) is formed on a light-transparent support substrate. The flexible substrate 12 includes: the display region DA; and a frame region NA disposed around the display region DA. The frame region NA includes: a terminal unit TS disposed at an end of the frame region NA; and a fold portion ZS disposed between the terminal unit TS and the display region DA, and extending in the Y direction.

At Step S2, a barrier layer 3 is formed. At Step S3, a TFT layer 4 is formed. At Step S4, a light-emitting-element layer 5 of a top emission type is formed. In the light-emitting-element layer 5 of the display region DA, a light-emitting element ES of a sub-pixel SG is formed. At Step S5, a sealing layer 6 is formed. At Step S6, an upper-face film is attached to the sealing layer 6. At Step S7, the support substrate is removed from the flexible substrate 12 with, for example, a laser beam emitted on the support substrate. At Step S8, a lower-face film 10 is attached to a lower face of the flexible substrate 12. At Step S9, a multilayer stack including the lower-face film 10, the flexible substrate 12, the barrier layer 3, the TFT layer 4, the light-emitting-element layer 5, and the sealing layer 6 is divided into a plurality of pieces (Step S9). At Step S10, to each of the obtained pieces, a functional film 39 is attached. At Step S11, an electronic circuit board (e.g. a driver chip and flexible printed-circuit board) is mounted on the terminal unit TS (including a terminal TMb) of the frame region NA. After Step S11, the display device 2 can be folded at the fold portion ZS of the frame region NA.

Steps S1 to S11 are carried out on a display device production apparatus (including a deposition apparatus carrying out each of Steps S1 to S5).

Figure 4:
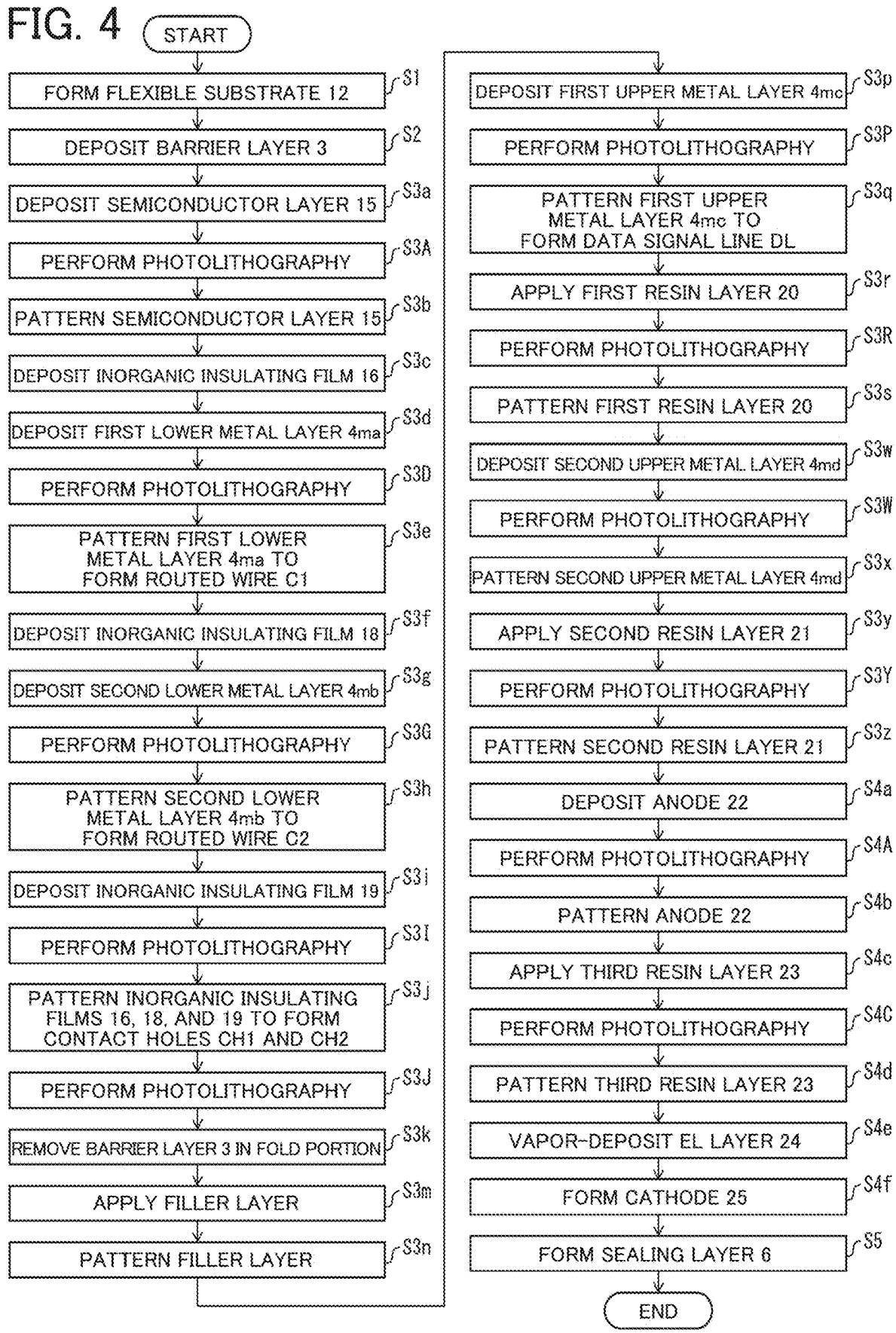
FIG. 4 is a flowchart showing in detail a part of the flowchart in FIG. 1.
Figure 6:
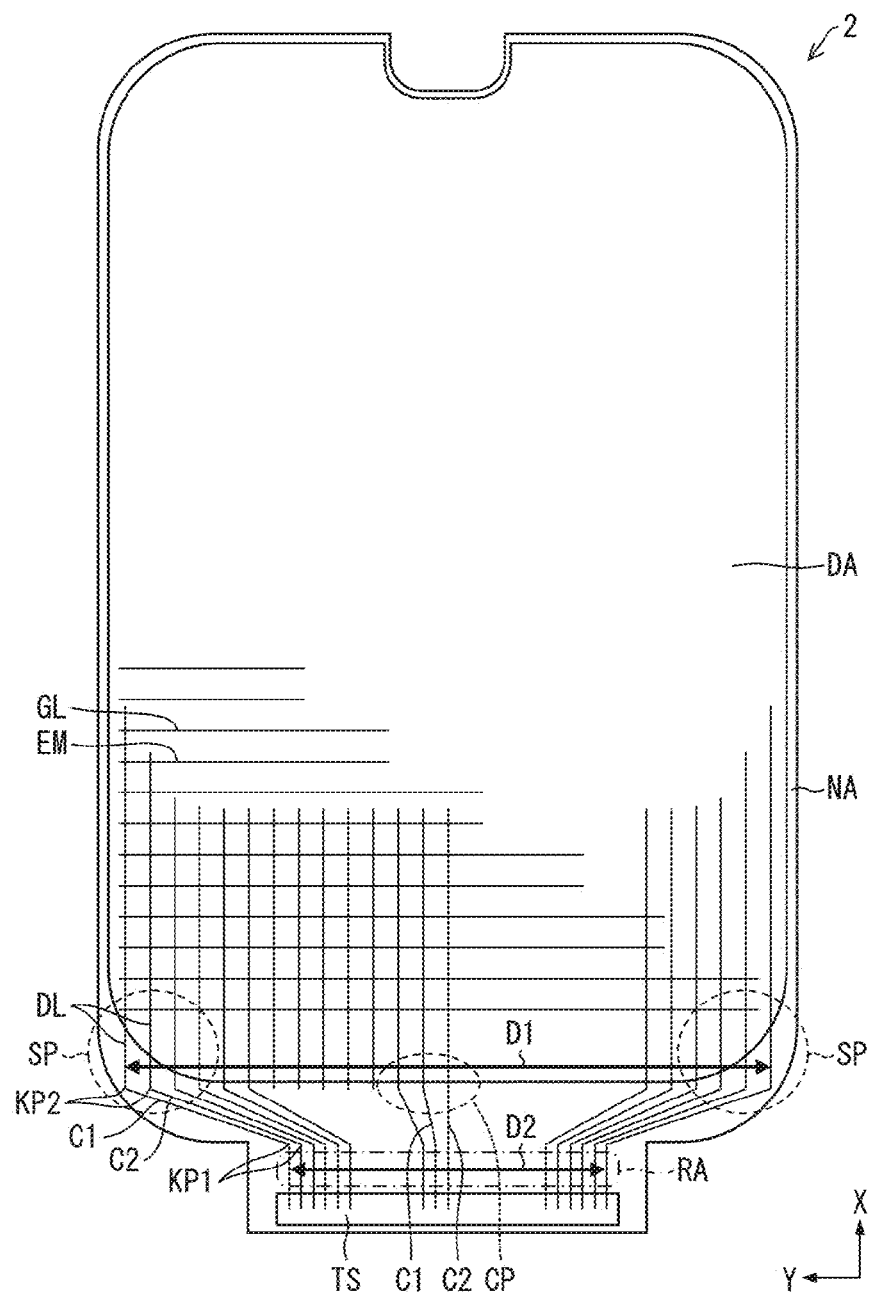
FIG. 6 is a plan view of a center portion and corner portions of the display region according to a first embodiment.

FIG. 4 is a flowchart showing in detail Steps S3 and S4 in FIG. 1. As shown in FIGS. 1 to 4, after Step S2, a semiconductor layer 15 is deposited at Step S3a. At Step S3A, photolithography is performed on the semiconductor layer 15. At Step S3b, the semiconductor layer 15 is patterned. At Step S3c, an inorganic insulating film 16 is deposited to serve as a lower inorganic insulating film. At Step S3d, a first lower metal layer 4ma (a first wire) is deposited. At Step S3D, photolithography is performed on the first lower metal layer 4ma. At Step S3e, the first lower metal layer 4ma is patterned to form a routed wire C1 (FIG. 6). At Step S3f, an inorganic insulating film 18 (a first interlayer insulating film) is deposited to serve as an intermediate inorganic insulating film. At Step S3g, a second lower metal layer 4mb (a second wire) is deposited. At Step S3G, photolithography is performed on the second lower metal layer 4mb. At Step S3h, the second lower metal layer 4mb is patterned to form a routed wire C2 (FIG. 6).

At Step S3i, an inorganic insulating film 19 (a second interlayer insulating film) is deposited to serve as an upper inorganic insulating film. At Step S3I, photolithography is performed on the inorganic insulating film 19. At Step S3*j*, the inorganic insulating films 16, 18, and 19 are patterned, and an anti-electrolytic-corrosion contact hole CH1 (FIG. 7), a connection-securing contact hole CH2 (FIG. 7), and a contact hole for a conductive electrode DE are formed. At Step S3J, photolithography is performed. At Step S3*k*, the barrier layer 3 and the inorganic insulating films 16, 18, and 19 in the fold portion ZS are removed, and a slit is formed.

Figure 7:
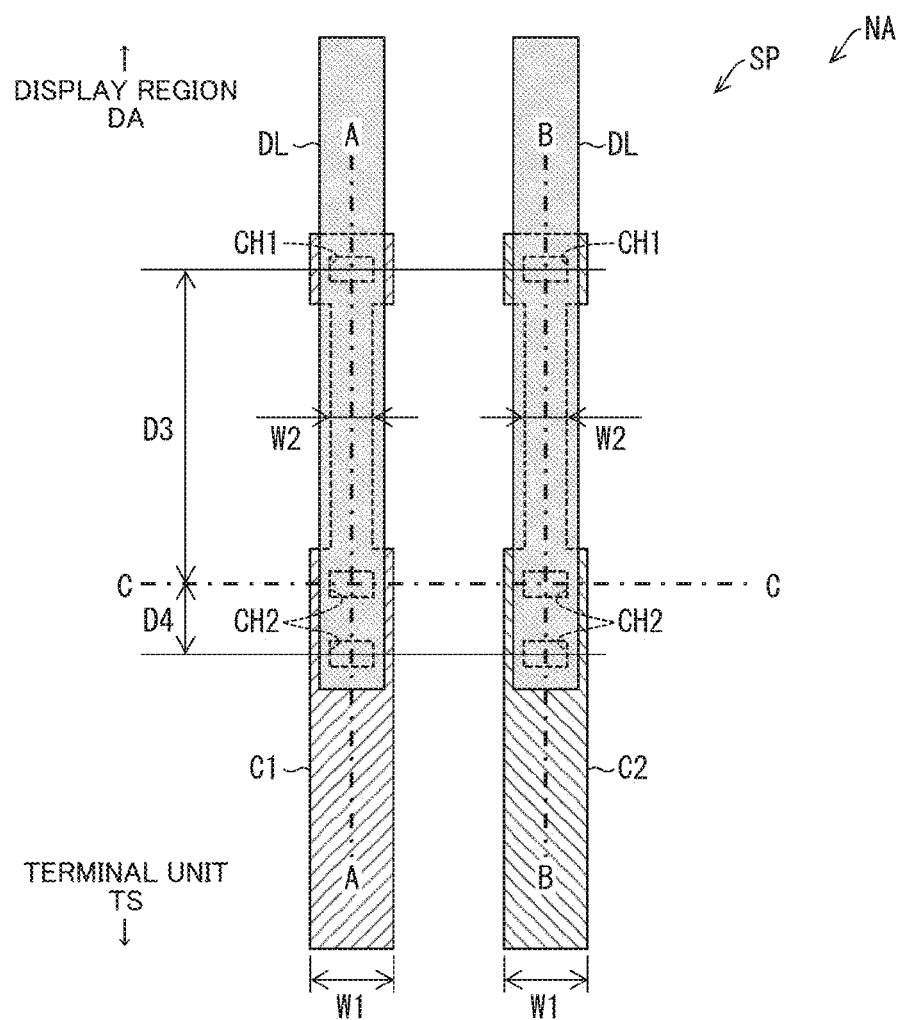
FIG. 7 is a plan view of a configuration of a frame region according to the first embodiment.

At Step S3*m*, a filler layer is applied. At Step S3*n*, the filler layer in a pixel of the display region DA is removed and patterned, while the filler layer only in the slit of the fold portion ZS in FIG. 2 is left unpatterned. At Step S3*p*, a first upper metal layer 4*mc* (a third wire) is deposited. At Step S3P, photolithography is performed on the first upper metal layer 4*mc*. At Step S3*q*, the first upper metal layer 4*mc* is patterned to form a data signal line DL (FIGS. 6 and 7).

At Step S3*r*, a first resin layer 20 is applied. At Step S3R, photolithography is performed on the first resin layer 20. At Step S3*s*, the first resin layer 20 is patterned.

At Step S3*w*, a second upper metal layer 4*md* is deposited. At Step S3W, photolithography is performed on the second upper metal layer 4*md*. At Step S3*x*, the second upper metal layer 4*md* is patterned. At Step S3*y*, a second resin layer 21 is applied. At Step S3Y, photolithography is performed on the second resin layer 21. At Step S3*z*, the second resin layer 21 is patterned.

At Step S4*a*, a metal layer is deposited for forming an anode 22. At Step S4A, photolithography is performed on the metal layer. At Step S4*b*, the metal layer is patterned to form the anode 22. At Step S4*c*, a third resin layer 23 is applied. At Step S4C, photolithography is performed on the third resin layer 23. At Step S4*d*, the third resin layer 23 is patterned. At Step S4*e*, an electroluminescent (EL) layer 24 is vapor-deposited. At Step S4*f*, a cathode 25 is formed. At Step S5, the sealing layer 6 is formed.

An exemplary material of the flexible substrate 12 includes polyimide. The flexible substrate 12 can be replaced with a double-layer polyimide film, and with an inorganic insulating film sandwiched between the polyimide layers.

The barrier layer 3 keeps the TFT layer 4 and the light-emitting-element layer 5 from such foreign objects as water, oxygen, and mobile ions. The barrier layer 3 can be, for example, a silicon oxide film, a silicon nitride film, or a silicon oxide nitride film formed by chemical vapor deposition (CVD). Alternatively, the barrier layer 3 can be formed of a multilayer film including these films.

The semiconductor layer 15 is formed of, for example, low-temperature polysilicon (LTPS) or oxide semiconductor (e.g. an In—Ga—Zn—O-based semiconductor).

Each of the first lower metal layer 4*ma*, the second lower metal layer 4*mb*, the first upper metal layer 4*mc*, and the second upper metal layer 4*md* is a monolayer metal film made of at least one of such metals as, for example, aluminum, tungsten, molybdenum, tantalum, chromium, titanium, and copper. Alternatively, each metal layer is a multilayer metal film formed of these metals. In particular, the first upper metal layer 4*mc* and the second upper metal layer 4*md* each can be a low-resistance metal layer formed of a low-resistance metal layer including a double-layer titanium film and an aluminum film sandwiched between the titanium layers. Moreover, the second upper metal layer 4*md* can also be a double-layer film formed of the aluminum film and the titanium layer above the aluminum film.

The first lower metal layer 4*ma* and the second lower metal layer 4*mb* are preferably formed of the same metal material. The first upper metal layer 4*mc* and the second upper metal layer 4*md* are preferably formed of the same metal material.

Each of the inorganic insulating films 16, 18, and 19 can be, for example, a silicon oxide ($SiO_x$) film or a silicon nitride ($SiN_x$) film formed by the CVD. Alternatively, each of the inorganic insulating films 16, 18, and 19 can be a multilayer film including these films.

The filler layer, the first resin layer 20, and the second resin layer 21 can be made of, for example, an applicable organic material such as polyimide and acrylic resin.

A transistor Tr includes: the semiconductor layer 15; and a gate electrode GE included in the first lower metal layer 4*ma*.

Figure 5:
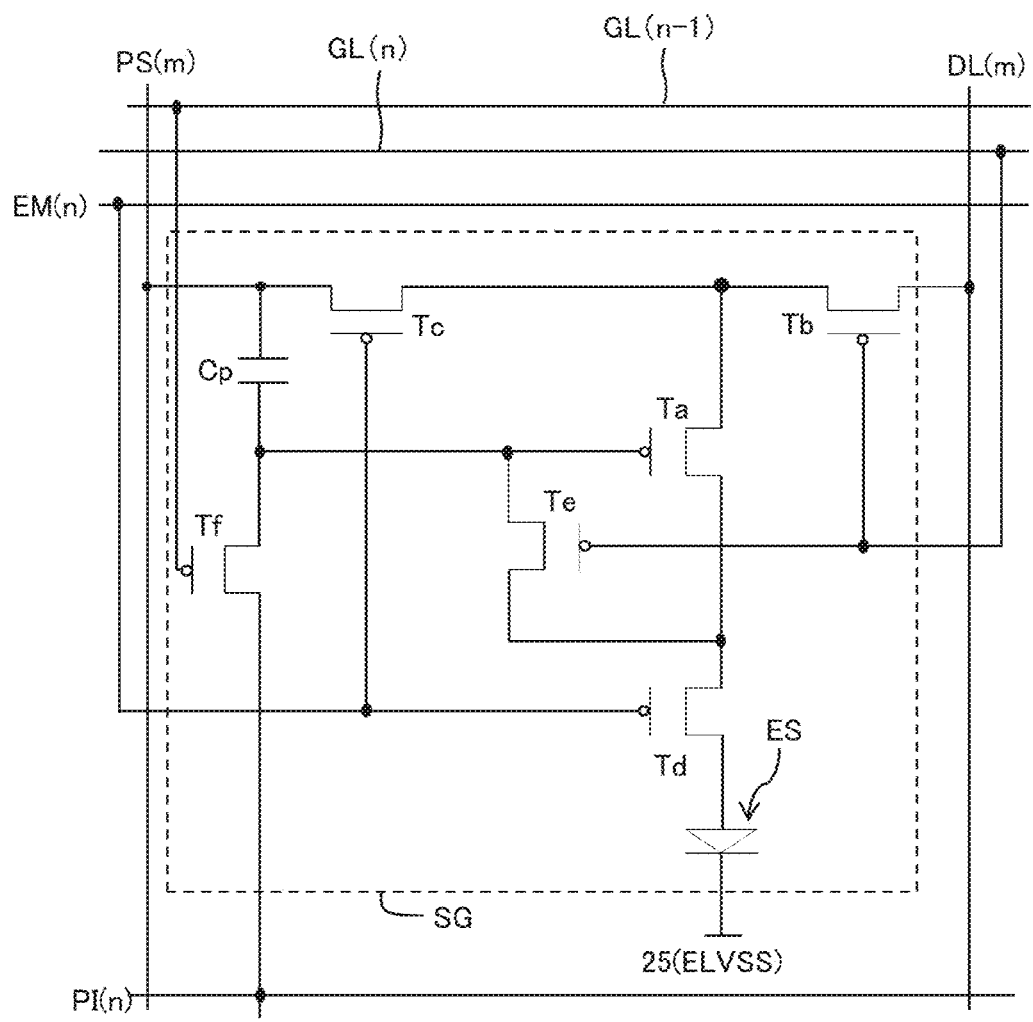
FIG. 5 is a circuit diagram illustrating a configuration of a sub-pixel.

The display region DA includes sup-pixels SG (in an m×n matrix) each provided with a pixel circuit illustrated in FIG. 5. The pixel circuit corresponds to an intersection of a data signal line DL(m) in the m-th column and a scan control line GL(n) in the n-th row. Note that the configuration of the pixel circuit described here is an example, and the pixel circuit can be formed of any other known configuration. The pixel circuit illustrated in FIG. 5 includes: one light-emitting element ES; six transistors (a drive transistor Ta, a write control transistor Tb, a power source supply control transistor Tc, a light-emission control transistor Td, a threshold-voltage compensation transistor Te, and an initialization transistor TI); and one capacitor Cp. The transistors Ta to Tf are p-channel transistors. The capacitor Cp is a capacitive element formed of two electrodes. A light-emission control line EM(n) (a control line) connects to a control terminal of each of the power source supply control transistor Tc and the light-emission control transistor Td. A scan control line GL(n) (a control line) connects to a control terminal of each of the write control transistor Tb and the threshold-voltage compensation transistor Te. A scan control line GL(n−1) connects to a control terminal of the initialization transistor Tf. An initialization power source line PI(n) connects to one of the conductive terminals of the initialization transistor Tf. A data signal line DL(m) connects to one of the conductive terminals of the write control transistor Tb. A high-voltage power source line PS(m) supplying a high power-source voltage ELVDD connects to one of the conductive terminals of the power source supply control transistor Tc. The cathode 25 of the light-emitting element ES is a common electrode in common among a plurality of pixel circuits. The cathode 25 electrically connects to a low power-source voltage ELVSS.

The pixel circuit in FIG. 5 is an example, and may be any given pixel circuit. The pixel circuit may be formed also of n-channel transistors.

The display region DA is configured as follows, for example. The first lower metal layer 4*ma* (the first wire) includes: the scan control line GL(n) extending in the Y direction; the light-emission control line EM(n) extending in the Y direction; a gate electrode of each of the transistors (Ta to Tf); and a gate wire GH (see FIG. 3). The second lower metal layer 4*mb* (the second wire) includes: the initialization power source line PI(n) extending in the Y direction; the high-voltage power source line extending in the Y direction; and an electrode CE (see FIG. 3) of the capacitor Cp. The first upper metal layer 4*mc* (the third wire) includes: the data signal line DL(m) extending in the X direction; the high-voltage power source line extending in the X direction; and a conductive electrode DE (a source/drain electrode) for each of the transistors. The second upper metal layer 4*md* (a fourth wire) includes high-voltage power source lines PS(m) extending in the X and Y directions and provided in a grid pattern. The above configuration is an example, and any wire may be included in any metal layer. Although the second upper metal layer 4md and the second resin layer 21 may be omitted, a high-voltage power source line formed of the second upper metal layer 4md can decrease resistance of the power source lines, and reduce variation in luminance caused by an IR drop.

The light-emitting-element layer 5 includes: the anode 22; a third resin layer (an edge cover) 23 covering an edge of the anode 22; the EL layer 24; and the cathode 25 provided above the EL layer 24. The third resin layer 23 can be made of, for example, an applicable organic material such as polyimide and acrylic resin.

In the display region DA, a display element is provided for each of the sub-pixels SG. The display element includes: the light-emitting element ES (e.g. an organic light-emitting diode (OLED) and a quantum dot light-emitting diode (QLED)); and a control circuit (formed in the TFT layer 4) of the light-emitting element ES. The light-emitting element ES, formed in the light-emitting-element layer 5, includes: the anode 22 and the EL layer 24 each shaped into an island; and the cathode 25.

The EL layer 24 includes a hole-injection layer, a hole-transport layer, a light-emitting layer, an electron-transport layer, and an electron-injection layer stacked on top of an other in the stated order from below. The light-emitting layer is formed by vapor deposition or ink-jet printing, and shaped into an island to overlap an opening of the third resin layer (the edge cover) 23. The other layers are each shaped into either an island or a monolithic form (a common layer). Moreover, one or more of the hole-injection layer, the hole-transport layer, the electron-transport layer, and the electron-injection layer can be omitted.

In vapor-deposition of the light-emitting layer for an organic light-emission diode (OLED), a fine metal mask (FMM) is used. The FMM is a sheet (e.g. invar) including many through holes. Organic material passing through one through hole forms a light-emitting layer (corresponding to one sub-pixel) shaped into an island.

The light-emitting layer for a quantum-dot light-emission diode (QLED) may be formed, for example, of a solvent into which quantum dots are dispersed. The solvent is applied by ink-jet printing to form the light-emitting layer shaped into an island (corresponding to one sub-pixel).

The anode 22, which reflects light, is formed of, for example, indium tin oxide (ITO) and either silver (Ag) or an alloy containing Ag stacked on top of an other. The cathode 25 can be formed of a light-transparent conductive material such as a MgAg alloy (an ultra-thin film), ITO, and indium zinc oxide (MO).

If the light-emitting element ES is an OLED, holes and electrons recombine together in the light-emitting layer by a current between the anode 22 and the cathode 25, which forms an exciton. While the exciton transforms to the ground state, light is released. Since the cathode 25 is light-transparent and the anode 22 is light-reflective, the light emitted from the EL layer 24 travels upwards. This is how the light-emitting-element layer 5 is of a top emission type.

If the light-emitting element ES is a QLED, holes and electrons recombine together in the light-emitting layer by a current between the anode 22 and the cathode 25, which forms an exciton. While the exciton transforms from the conduction band level to the valence band level of the quantum dots, light (fluorescence) is released.

The light-emitting-element layer 5 may include a light-emitting element (such as an inorganic light-emitting diode) other than the OLED and the QLED.

The sealing layer 6, which is light-transparent, includes: an inorganic sealing film 26 covering the cathode 25; an organic buffer film 27 provided above the inorganic sealing film 26; and an inorganic sealing film 28 provided above the organic buffer film 27. The sealing layer 6 covers the light-emitting-element layer 5 to keep the light-emitting-element 5 from such foreign objects as water, oxygen, and mobile ions.

The inorganic sealing film 26 and the inorganic sealing film 28 are inorganic insulating films. Each of the inorganic sealing film 26 and the inorganic sealing film 28 can be, for example, a silicon oxide film, a silicon nitride film, or a silicon oxide nitride film formed by chemical vapor deposition (CVD). Alternatively, each of the inorganic sealing film 26 and the inorganic sealing film 28 can be formed of a multilayer film including these films. The organic buffer film 27 is a light-transparent organic film provided with planarity effects. The organic buffer film 27 can be made of an applicable organic material such as acrylic resin. The organic buffer film 27 can be formed by, for example, ink-jet printing.

The lower-face film 10 is attached to the lower face of the flexible substrate 12 after the support substrate is removed. Hence, the lower-face film 10 provides the display device with excellent flexibility. The lower-face film 10 is, for example, a PET film. The functional film 39 has at least one of, for example, an adaptive optics correction function, a touch sensor function, and a protection function.

The display region DA includes: a pair of corner portions SP disposed in two corners of the display region DA, and provided closer to the terminal unit TS in the Y direction (a first direction); and a center portion CP disposed between the pair of the corner portions SP. The corner portions SP of the display region DA are rounded, and protrude outwards. Moreover, the frame region NA is also rounded to conform with the corner portions SP.

Figure 8:
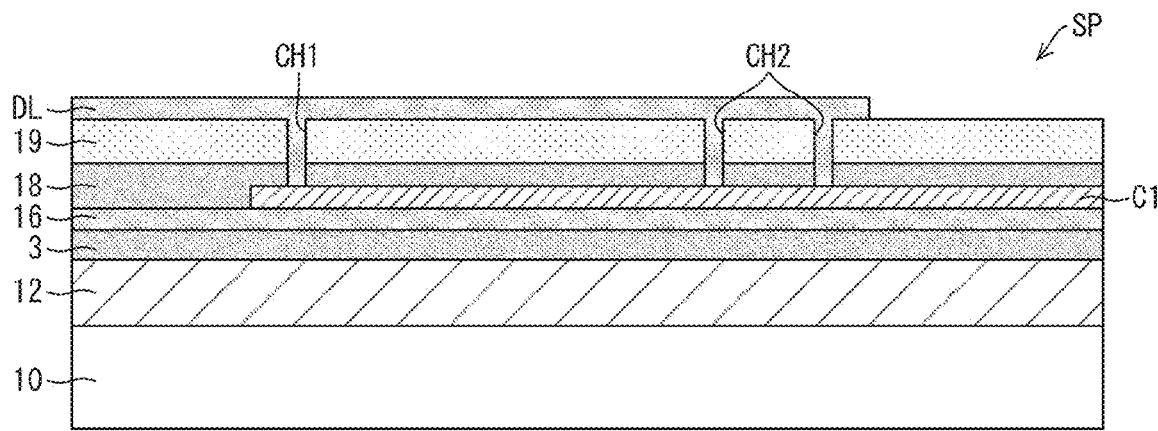
FIG. 8 is a cross-sectional view taken along plane A-A in FIG. 7.
Figure 9:
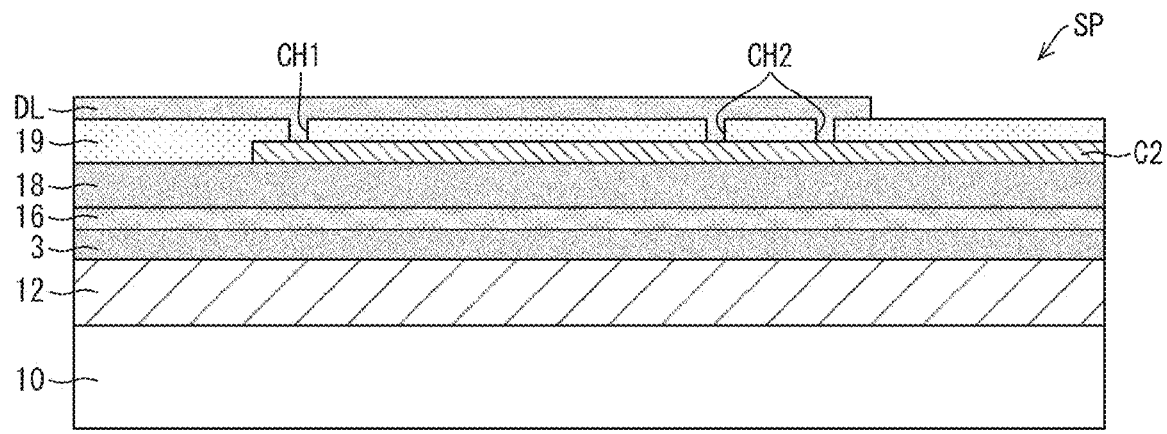
FIG. 9 is a cross-sectional view taken along plane B-B in FIG. 7.
Figure 10:
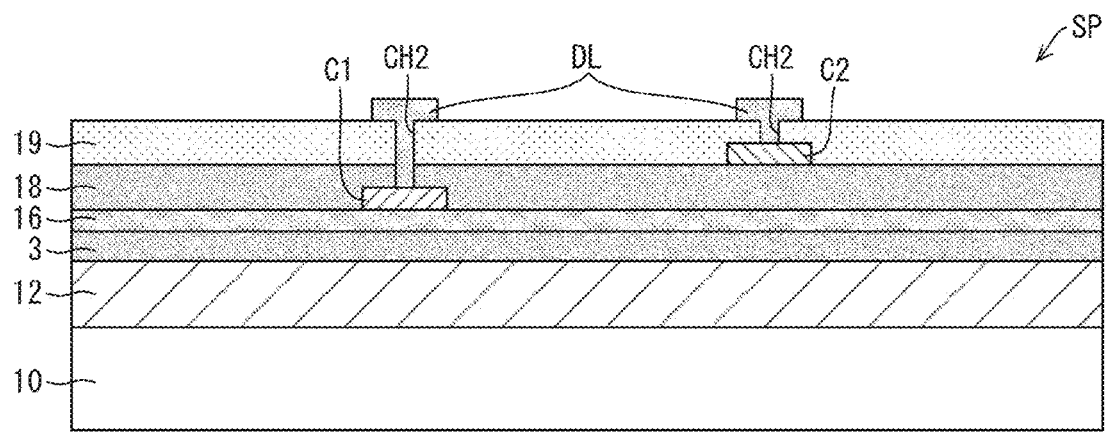
FIG. 10 is a cross-sectional view taken along plane C-C in FIG. 7.
Figure 11:
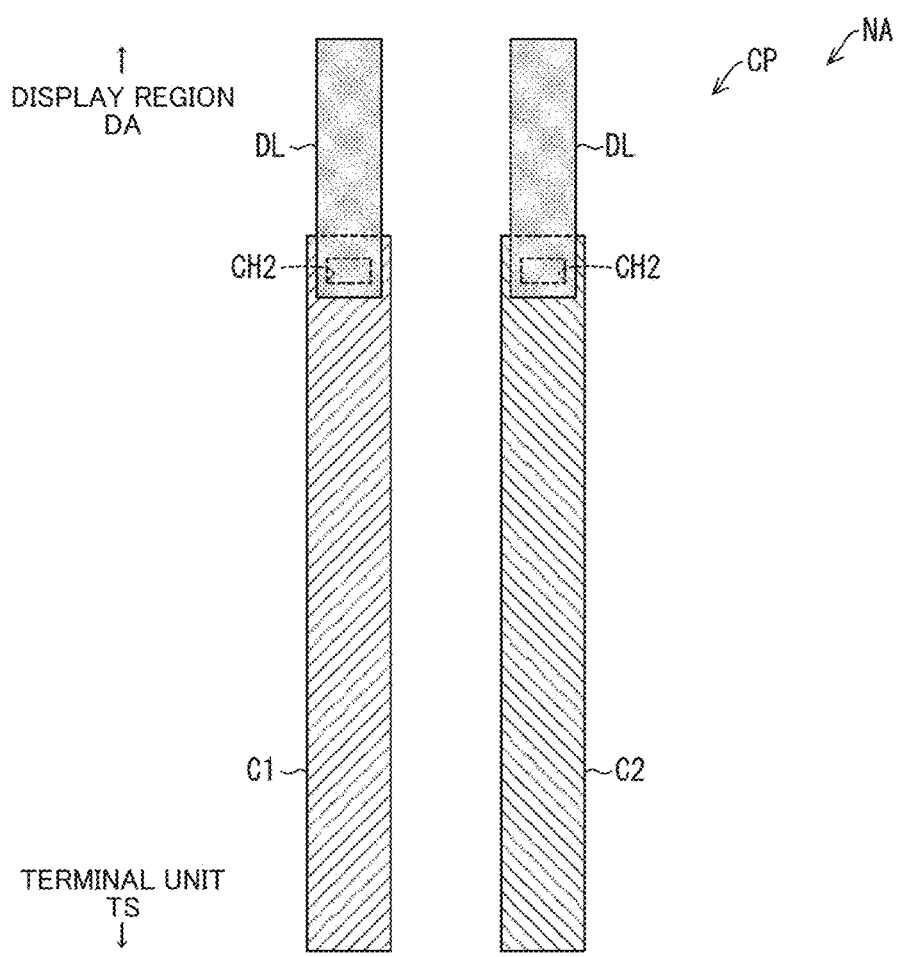
FIG. 11 is a plan view of a configuration of the frame region according to the first embodiment.

FIG. 6 is a plan view of the center portion CP and the corner portions SP of the display region DA according to the first embodiment. FIG. 7 is a plan view of a configuration of the frame region NA along a corner portion SP according to the first embodiment. FIG. 8 is a cross-sectional view taken along plane A-A in FIG. 7. FIG. 9 is a cross-sectional view taken along plane B-B in FIG. 7. FIG. 10 is a cross-sectional view taken along plane C-C in FIG. 7. FIG. 11 is a plan view of a configuration of the frame region NA along the center portion CP. Identical reference signs are used to denote identical or substantially identical constituent features throughout the drawings, and will not be elaborated upon here.

The display region DA includes: a plurality of the scan control lines GL (control lines) and a plurality of the light-emission control lines EM (control lines) extending in the Y direction (the first direction); a plurality of the data signal lines DL extending in the X direction (a second direction); a plurality of the pixel circuits (FIG. 5) each provided to a corresponding one of intersections of (i) the scan control lines GL and the light-emission control lines EM and (ii) the data signal lines DL; and a plurality of the light-emitting elements ES (FIG. 3) each provided to a corresponding one of the pixel circuits.

The frame region NA includes a plurality of the routed wires C1 and C2 electrically connecting together the data signal lines DL and a plurality of the terminals TMb (FIG. 2) provided to the terminal unit TS. As illustrated in FIGS. 8 and 9, each of the routed wires C1 is included in the first lower metal layer 4ma (the first wire in FIG. 3), and each of the routed wires C2 is included in the second lower metal layer 4mb (the second wire in FIG. 3).

A plurality of (at least two or more) contact holes correspond to each of the routed wires C1 and C2 (corner portion routed wires) electrically connected to data signal lines DL running through the corner portions SP of the display region DA. Two or more of the contact holes include an anti-electrolytic-corrosion contact hole CH1 positioned farther away from the terminal unit TS than an other contact hole included in the two or more of the contact holes. The other contact hole included in the two or more of the contact holes is a connection-securing contact hole CH2 positioned closer to the terminal unit TS than the anti-electrolytic-corrosion contact hole CH1.

As illustrated in FIG. 8, a routed wire C1 corresponding to a corner portion SP electrically connects to a data signal line DL through an anti-electrolytic-corrosion contact hole CH1 and connection-securing contact holes CH2 provided to the inorganic insulating film 18 (the first interlayer insulating film) and the inorganic insulating film 19 (the second interlayer insulating film). As illustrated in FIG. 9, a routed wire C2 corresponding to the corner portion SP electrically connects to a data signal line DL through an anti-electrolytic-corrosion contact hole CH1 and connection-securing contact holes CH2 provided to the inorganic insulating film 19 (the second interlayer insulating film). Likewise, a routed wire C1 (a center portion routed wire) corresponding to the center portion CP electrically connects to a data signal line DL through a connection-securing contact hole CH2 provided to the inorganic insulating film 18 (the first interlayer insulating film) and the inorganic insulating film 19 (the second interlayer insulating film). A routed wire C2 (a center portion routed wire) corresponding to the center portion CP electrically connects to a data signal line DL through a connection-securing contact hole CH2 provided to the inorganic insulating film 19 (the second interlayer insulating film).

The routed wires C1 and C2 electrically connected to the data signal lines DL running through the corner portions SP of the display region DA are longer than the routed wires C1 and C2 electrically connected to the data signal lines DL running through the center portion CP of the display region DA. Here, the lengths of the routed wires C1 and C2 are lengths of the respective metal layers extending as they are. For example, the length of the routed wires C1 is a length of the first lower metal layer 4ma (the first wire) extending as it is. As illustrated in FIGS. 7 and 11, the length ranges from (i) one end toward the display region DA (i.e. the routed wires C1 are reconnected at one end to, for example, an other metal layer; namely, the first upper metal layer 4mc (the third wire)) to (ii) an other end toward the terminal unit TS (i.e. the routed wires C1 are reconnected at an other end to, for example, an other metal layer; namely, the first upper metal layer 4mc (the third wire)).

Hence, as illustrated in FIG. 6, the routed wires C1 and C2 corresponding to the corner portions SP are longer than the routed wires C1 and C2 corresponding to the center portion CP. Such a feature is more apparent when the corner portions SP are rounded. Even if the corner portions SP are not rounded, the width of a routing region RA in the Y direction is narrower than the width of the display region DA in the Y direction. That is why the routed wires C1 and C2 corresponding to the corner portions SP are longer than the routed wires C1 and C2 corresponding to the center portion CP.

Contact holes (including the anti-electrolytic-corrosion contact holes CH1 and the connection-securing contact holes CH2), which are related to the each of routed wires C1 and C2 electrically connected to the data signal lines DL running through the corner portions SP of the display region DA, are larger in number than contact holes (the connection-securing contact holes CH2), which are related to each of the routed wires C1 and C2 electrically connected to the data signal lines DL running through the center portion CP of the display region DA. For example, in FIG. 7, there are three contact holes (one anti-electrolytic-corrosion contact hole CH1 and two connection-securing contact holes CH2) corresponding to a corner portion SP. In FIG. 11, there is one contact hole (one connection-securing contact hole CH2) corresponding to the center portion CP. The number of the contact holes shall not be limited to the above numbers. The contact holes related to each of the routed wires C1 and C2 corresponding to the corner portions SP may be at least greater in number than the contact holes related to each of the routed wires C1 and C2 corresponding to the center portion CP. If one contact hole is provided to correspond to the center portion CP, at least two contact holes may be provided to correspond to the corner portions SP. For example, two contact holes in total including one anti-electrolytic-corrosion contact hole CH1 and one connection-securing contact hole CH2 may be provided to correspond to the corner portions SP. Moreover, two contact holes corresponding to the center portion CP; that is, two connection-securing contact holes CH2, may be provided. In such a case, at least three or more contact holes are provided to correspond to the corner portions SP. Furthermore, as illustrated in FIG. 7, the connection-securing contact holes CH2 are preferably larger in number than the anti-electrolytic-corrosion contact holes CH1.

The anti-electrolytic-corrosion contact holes CH1 serve as a conductor rod against electrolytic corrosion developed on the routed wires C1 and C2 at one end across from the terminal unit TS. The connection-securing contact holes CH2 secure electrical connection between the data lines DL and the routed wires C1 and C2 when electrolytic corrosion develops on the routed wires C1 and C2 at one end.

In producing a plurality of display panel patterns on one insulating mother substrate made of glass and organic film, a spin cleaning step of rotating this insulating mother substrate and applying such a liquid as a cleaning solution is likely to provide an outer periphery of the insulating mother substrate with electrical charges and to cause electrolytic corrosion. The electrical charges are likely to develop on a particularly long wiring pattern of the display panel pattern provided to the outer periphery of the insulating mother substrate. Moreover, the electrical charges are likely to develop in an on-going step in which a circuit of the display panel pattern is not completely formed, because the provided electrical charges are less likely to dissipate from an electrically floating wiring pattern.

Of the routed wires C1 and C2 routed from the terminal unit TS, routed wires C1 and C2 provided outwards and corresponding to the corner portions SP have contact holes that are likely to develop electrolytic corrosion.

Actually, a problem is, contact holes included in the routed wires C1 and C2 and provided at one end across from the terminal unit TS are electrically disconnected because of the electrolytic corrosion developing in connections between the data signal lines DL and the routed wires C1 and C2 corresponding to the gate wires GH routed from the terminal unit TS to the display region DA.

In the first embodiment, the connection-securing contact holes CH2 are provided in connections between the data signal lines DL and the routed wires C1 and C2. The connection-securing contact holes CH2 are separate from the anti-electrolytic-corrosion contact holes CH1 on the routed wires C1 and C2 at one end. Hence, even if contact holes provided to the routed wires C1 and C2 at one end (i.e. the anti-electrolytic-corrosion contact holes CH1) are disconnected because of electrolytic corrosion, the connection-securing contact holes CH2 secure electrical connection between the data signal lines DL and the routed wires C1 and C2, reducing the risk of electrical malfunction (poor contact).

A third distance D3 between an anti-electrolytic-corrosion contact hole CH1 and a connection-securing contact hole CH2 is twice as great as or greater than, and more preferably five times as great as or greater than, a width W1 of each of the routed wires C1 and C2 provided with the anti-electrolytic-corrosion contact hole CH1. Moreover, the third distance D3 is preferably longer than the fourth distance D4 between the connection-securing contact holes CH2. Advantageous effects to be obtained are greater as the anti-electrolytic-corrosion contact holes CH1 and the connection-securing contact holes CH2 are farther spaced apart from each other. Such a feature makes it possible to keep the connection-securing contact holes CH2 from electrolytic corrosion developing in the anti-electrolytic-corrosion contact holes CH1.

As illustrated in FIG. 7, a width W2, of each of the routed wires C1 and C2, between the anti-electrolytic-corrosion contact hole CH1 and a connection-securing contact hole CH2 is narrower than the width W1, of each of the routed wires C1 and C2, including the connection-securing contact holes CH2. Hence, even if electrolytic corrosion develops in the anti-electrolytic-corrosion contact holes CH1, the routed wires C1 and C2 corresponding to the width W2 are cut so that the connection-securing contact holes CH2 can be kept from the electrolytic corrosion. Note that if the anti-electrolytic-corrosion contact holes CH1 are provided, the width W1 and the width W2 may be substantially the same. The substantially the same widths still achieve advantageous effects against electrical disconnection.

Figure 12:
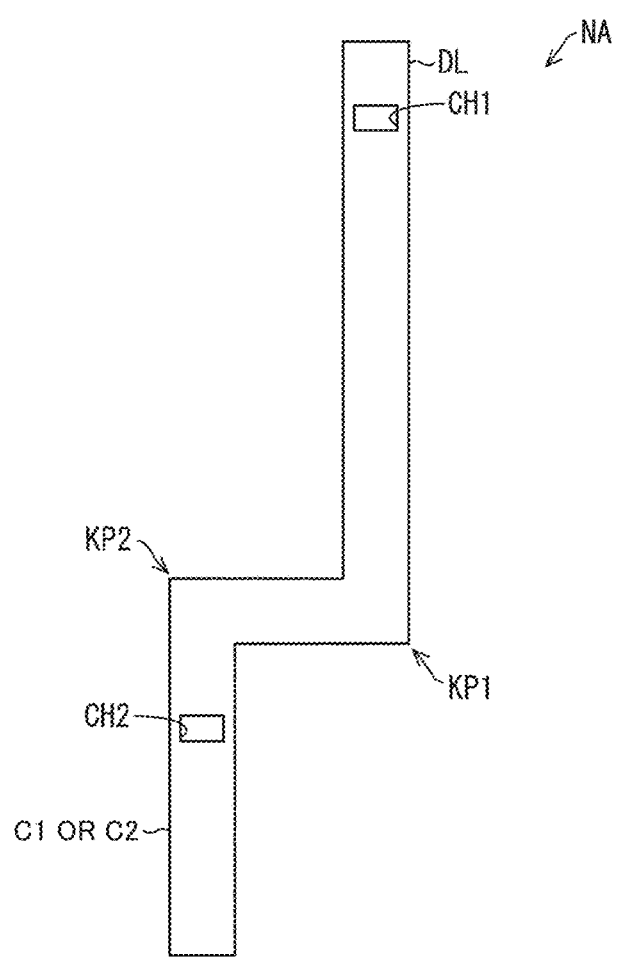
FIG. 12 is a plan view of a modification of the configuration of the frame region according to the first embodiment.

FIG. 12 is a plan view of a modification of the configuration of the frame region NA. Each of the routed wires C1 and C2 laid along the corner portions SP and the center portion CP may bend at least at two bending points KP1 and KP2 between an anti-electrolytic-corrosion contact hole CH1 and a connection-securing contact hole CH2, and extend. Hence, even if electrolytic corrosion develops in the anti-electrolytic-corrosion contact hole CH1, the routed wire C1 or the routed wire C2 is cut at the bending point KP1 or the bending point KP2. Such a feature makes it possible to keep the connection-securing contact hole CH2 from the electrolytic corrosion.

Moreover, the number of the anti-electrolytic-corrosion contact holes CH1 may be the same as the number of the spin cleaning steps. Hence, even if electrolytic corrosion develops for each spin cleaning step, the problem can be addressed with as many anti-electrolytic-corrosion contact holes CH1 as the spin cleaning steps. Thus, the connection-securing contact holes CH2 secure electrical connection.

The electrolytic corrosion develops after formation of the contact holes. When the electrolytic corrosion develops, base materials; namely, the first lower metal layer 4ma and the second lower metal layer 4mb, fail to work correctly. Hence, the number of the contact holes is increased not only by merely extending the connections in which the data signal lines DL and the routed wires C1 and C2 overlap, but also by providing the anti-electrolytic-corrosion contact holes CH1 and the connection-securing contact holes CH2.

The anti-electrolytic-corrosion contact holes CH1 and the connection-securing contact holes CH2 may be the same or different in size.

Figure 13:
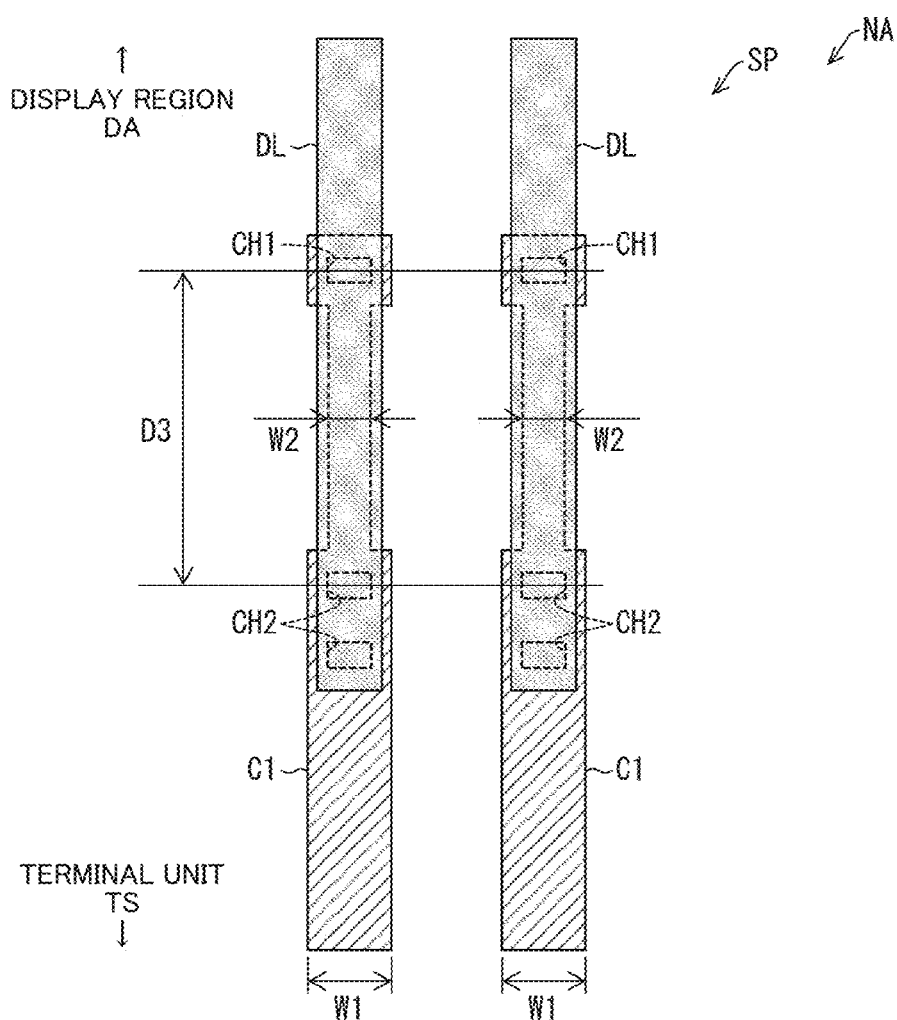
FIG. 13 is a plan view of a configuration of the frame region according to the first embodiment.
Figure 14:
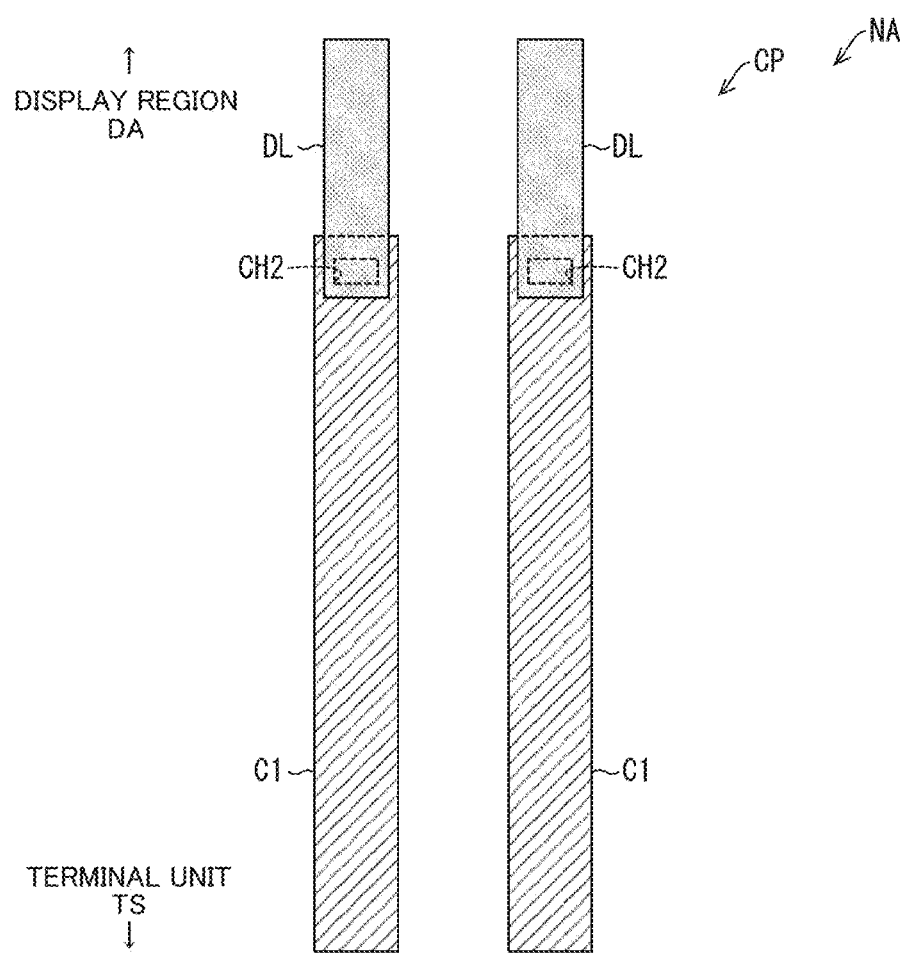
FIG. 14 is a plan view of a configuration of the frame region according to the first embodiment.

In an example shown in such drawings as FIG. 7, the routed wires C1 correspond to the first lower metal layer 4ma and the routed wires C2 correspond to the second lower metal layer 4mb. Alternatively, as illustrated in FIGS. 13 and 14, only the routed wires C1 corresponding to the first lower metal layer 4ma may be provided.

As illustrated in FIG. 6, a first distance D1 between a contact hole corresponding to a routed wire C1 electrically connecting to a data signal line DL running through one of the corner portions SP of the display region DA and an other contact hole corresponding to an other routed wire C1 electrically connecting to an other data signal line DL running through an other one of the corner portions SP of the display region DA is longer than a second distance D2 between a routed wire C1 running in the routing region RA and provided closer to the one of the corner portions SP and an other routed wire C1 running in the routing region RA and provided closer to the other one of the corner portions SP. The routing region RA is provided between the terminal unit TS and the display region DA. The above features also apply to the routed wires C2.

Figure 15:
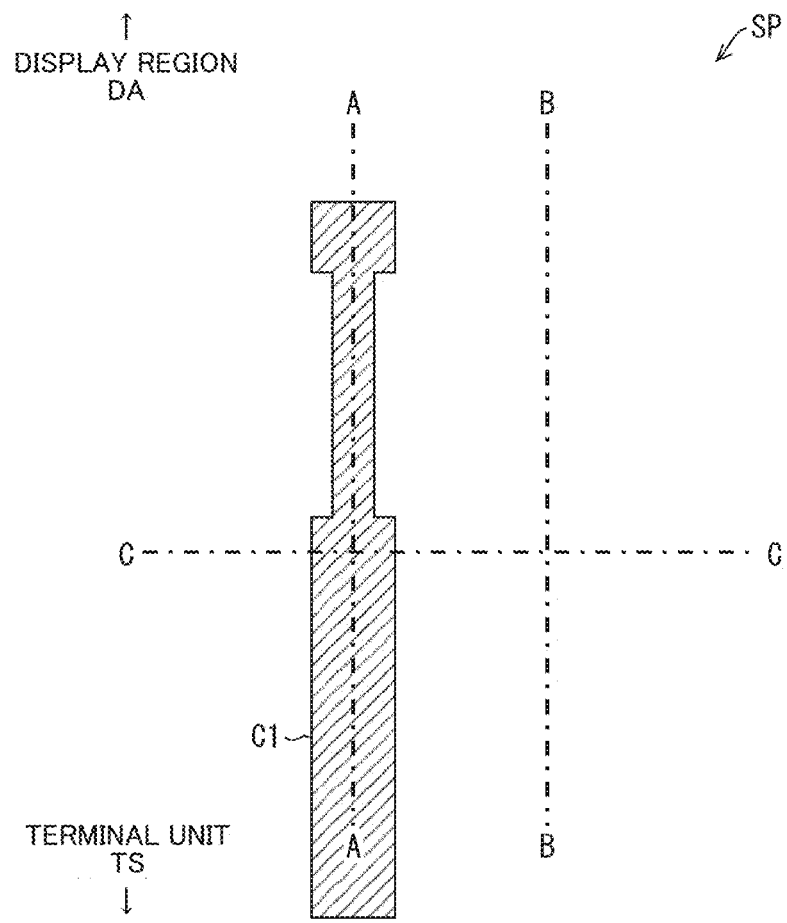
FIG. 15 is a plan view showing a step to produce routed lines of the frame region.
Figure 16:
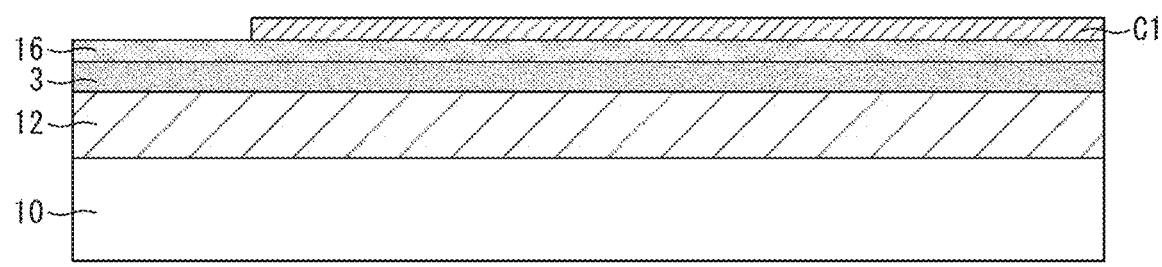
FIG. 16 is a cross-sectional view taken along plane A-A in FIG. 15.
Figure 17:
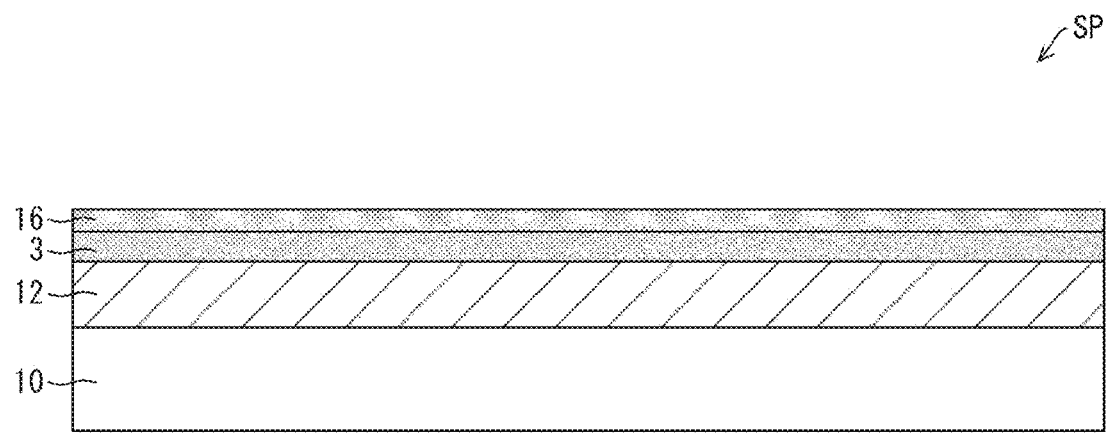
FIG. 17 is a cross-sectional view taken along plane B-B in FIG. 15.
Figure 18:
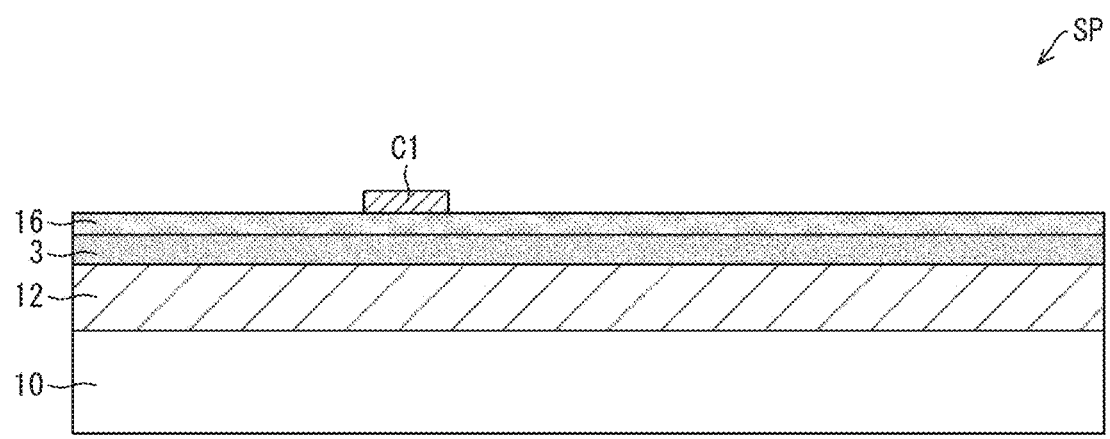
FIG. 18 is a cross-sectional view taken along plane C-C in FIG. 15.

FIG. 15 is a plan view showing a step to produce a routed line C1 of the frame region NA. FIG. 16 is a cross-sectional view taken along plane A-A in FIG. 15. FIG. 17 is a cross-sectional view taken along plane B-B in FIG. 15. FIG. 18 is a cross-sectional view taken along plane C-C in FIG. 15. Identical reference signs are used to denote identical or substantially identical constituent features throughout the drawings, and will not be elaborated upon here.

At Step S3e previously shown in FIG. 4, the first lower metal layer 4ma (FIG. 3) is patterned to form a routed wire C1 on the inorganic insulating film 16 as illustrated in FIGS. 15 to 18.

Figure 19:
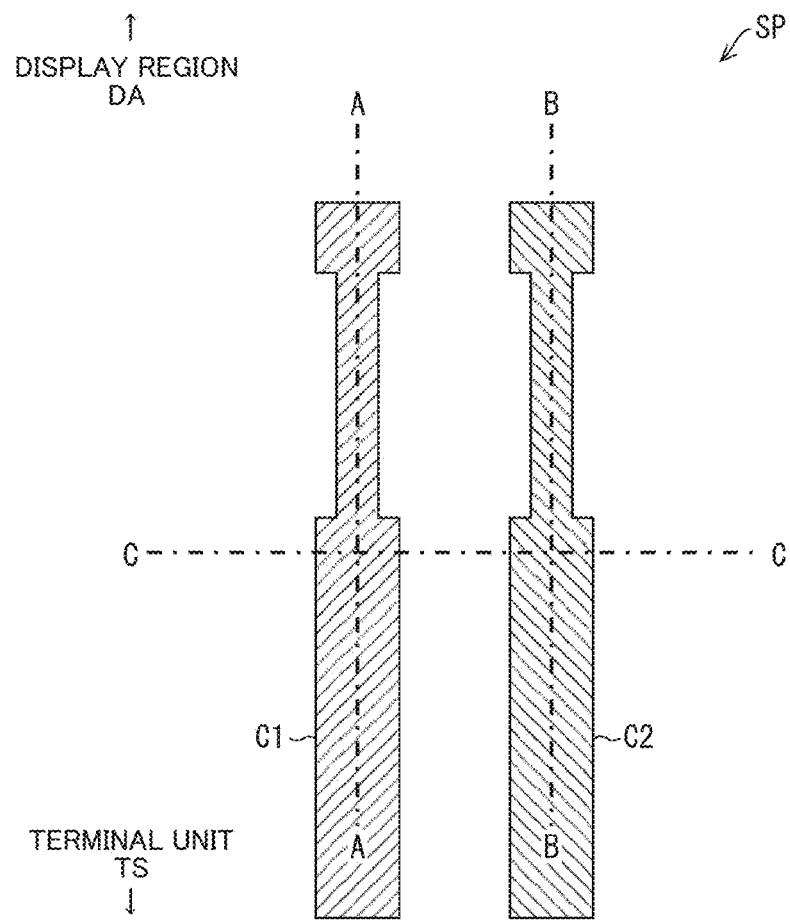
FIG. 19 is a plan view showing a step to produce other routed wires of the frame region.
Figure 20:
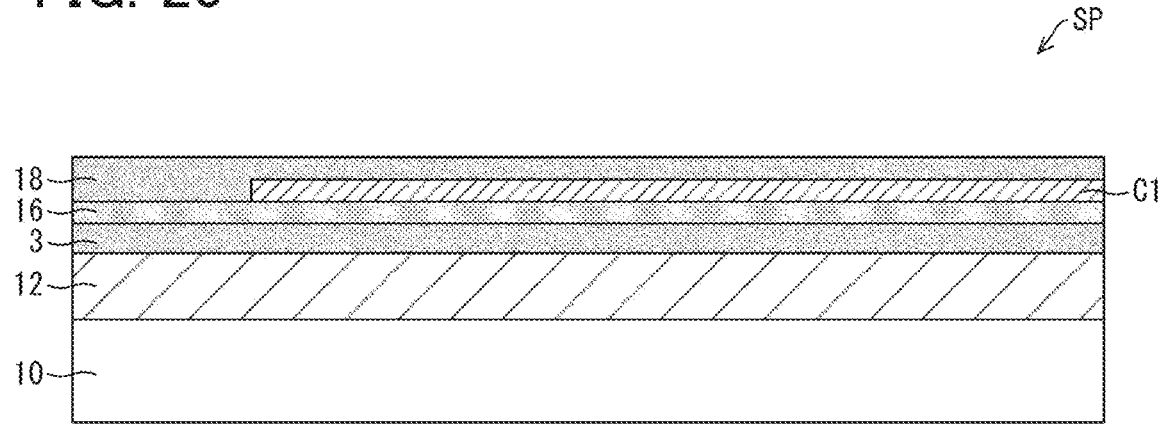
FIG. 20 is a cross-sectional view taken along plane A-A in FIG. 19.
Figure 21:
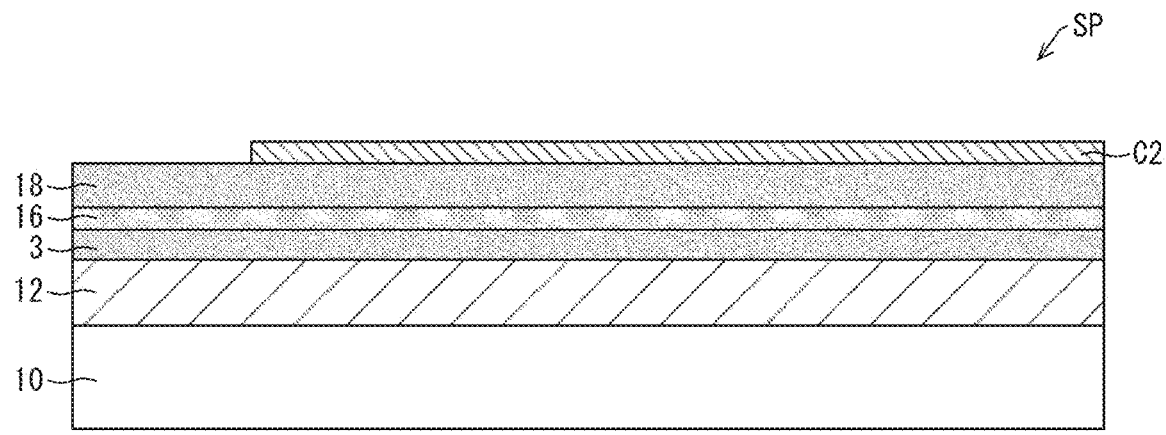
FIG. 21 is a cross-sectional view taken along plane B-B in FIG. 19.
Figure 22:
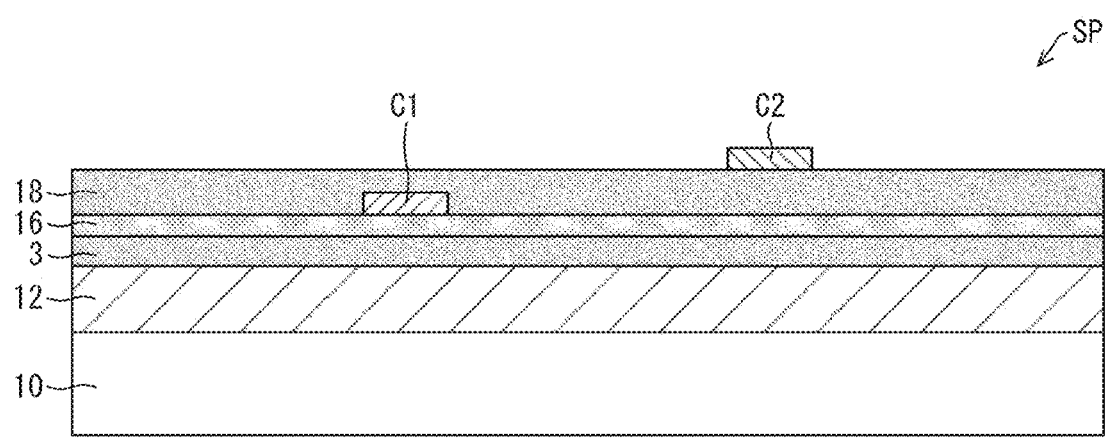
FIG. 22 is a cross-sectional view taken along plane C-C in FIG. 19.

FIG. 19 is a plan view showing a step to produce a routed line C2 of the frame region NA. FIG. 20 is a cross-sectional view taken along plane A-A in FIG. 19. FIG. 21 is a cross-sectional view taken along plane B-B in FIG. 19. FIG. 22 is a cross-sectional view taken along plane C-C in FIG. 19. Identical reference signs are used to denote identical or substantially identical constituent features throughout the drawings, and will not be elaborated upon here.

At Step S3h previously shown in FIG. 4, the second lower metal layer 4mb (FIG. 3) is patterned to form a routed wire C2 on the inorganic insulating film 18 as illustrated in FIGS. 19 to 22.

Figure 23:
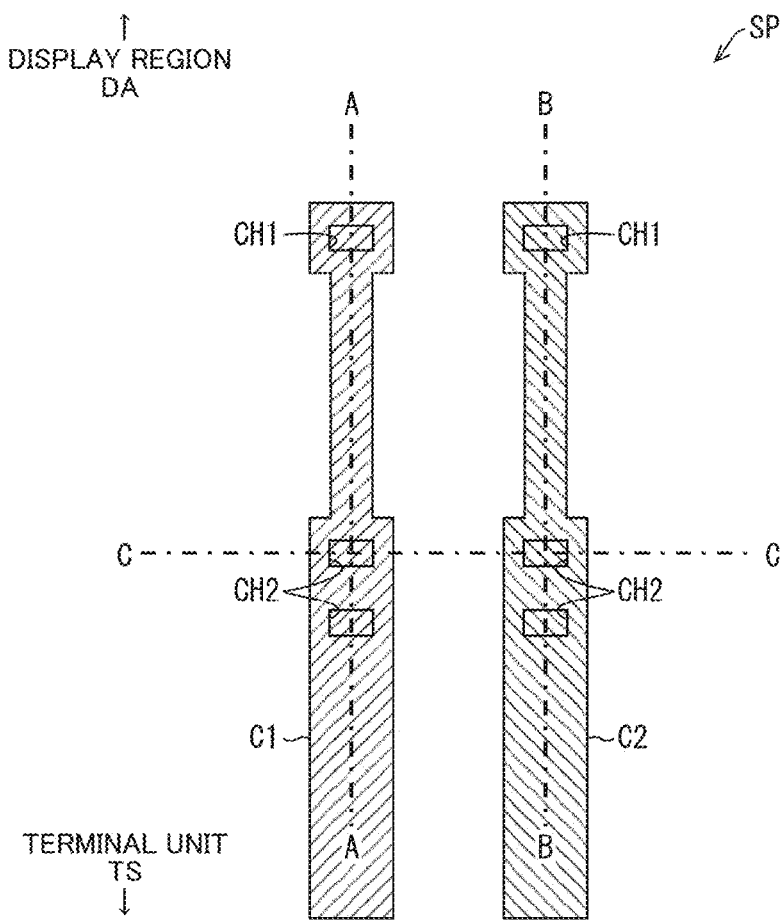
FIG. 23 is a plan view showing a step to produce anti-electrolytic-corrosion contact holes and connection-securing contact holes of the frame region.
Figure 24:
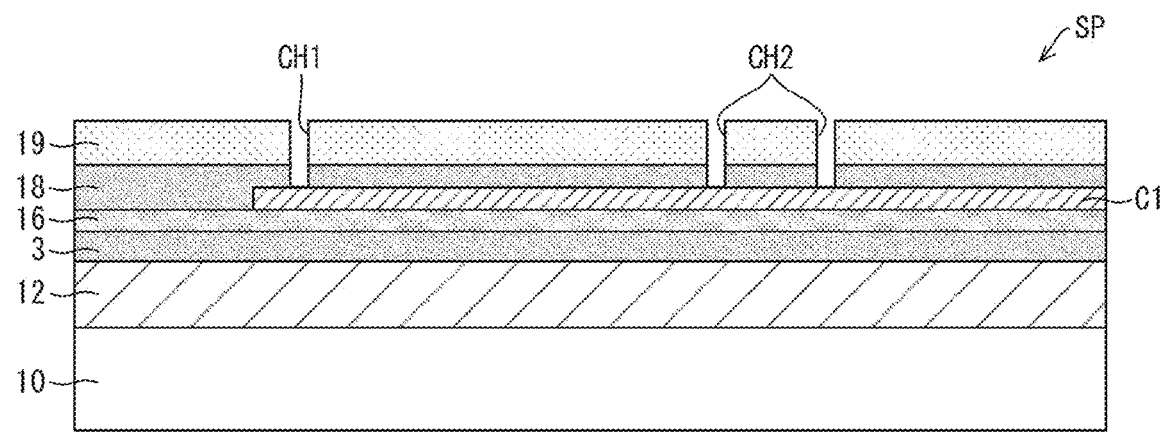
FIG. 24 is a cross-sectional view taken along plane A-A in FIG. 23.
Figure 25:
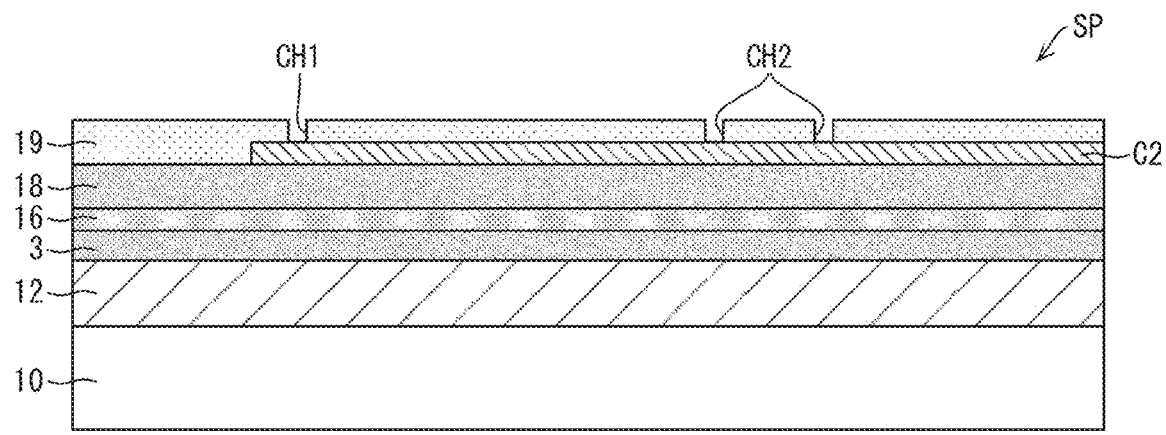
FIG. 25 is a cross-sectional view taken along plane B-B in FIG. 23.
Figure 26:
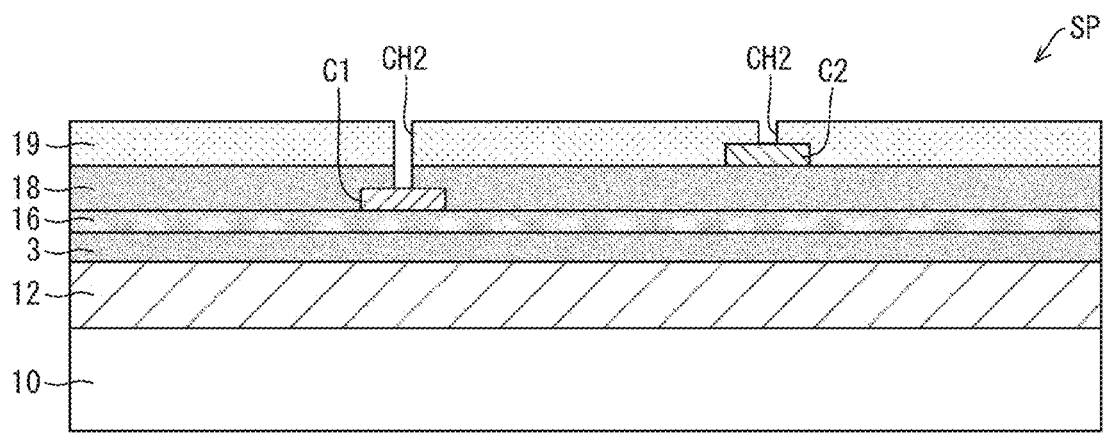
FIG. 26 is a cross-sectional view taken along plane C-C in FIG. 23.

FIG. 23 is a plan view showing a step to produce anti-electrolytic-corrosion contact holes CH1 and connection-securing contact holes CH2. FIG. 24 is a cross-sectional view taken along plane A-A in FIG. 23. FIG. 25 is a cross-sectional view taken along plane B-B in FIG. 23. FIG. 26 is a cross-sectional view taken along plane C-C in FIG. 23. Identical reference signs are used to denote identical or substantially identical constituent features throughout the drawings, and will not be elaborated upon here.

At Step S3j previously shown in FIG. 4, an anti-electrolytic-corrosion contact hole CH1 and connection-securing contact holes CH2 corresponding to a routed wire C1 are formed to reach the routed wire C1 through the inorganic insulating films 18 and 19 as illustrated in FIGS. 23, 24, and 26. After that, an anti-electrolytic-corrosion contact hole CH1 and connection-securing contact holes CH2 corresponding to a routed wire C2 are formed to reach the routed wire C2 through the inorganic insulating film 19 as illustrated in FIGS. 23, 25, and 26.

Figure 27:
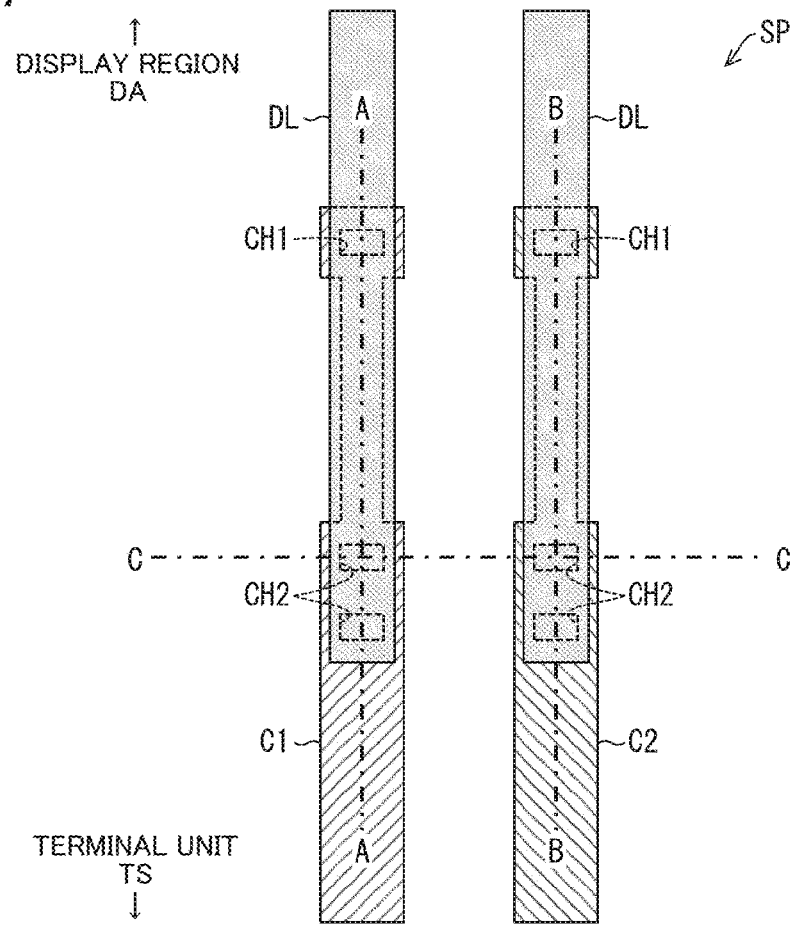
FIG. 27 is a plan view showing a step to produce data signal lines of the frame region.
Figure 28:
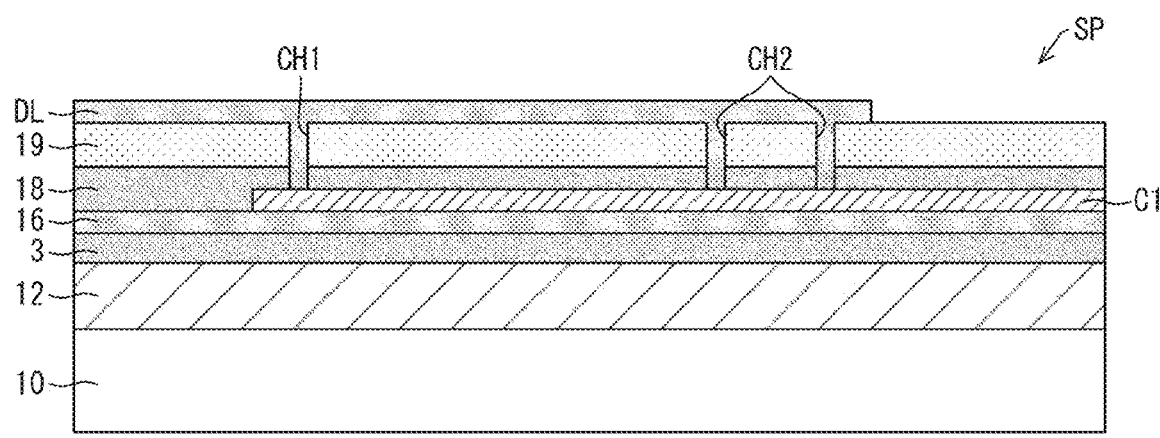
FIG. 28 is a cross-sectional view taken along plane A-A in FIG. 27.
Figure 29:
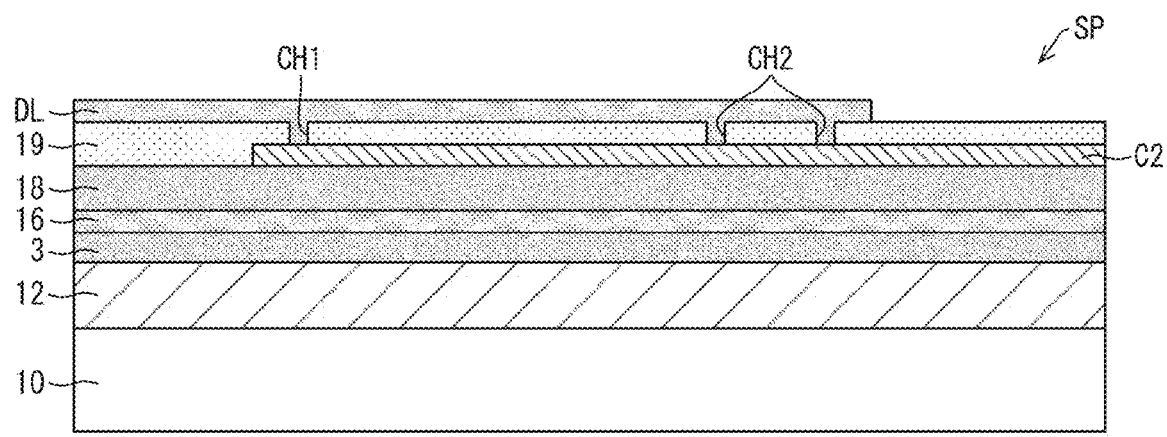
FIG. 29 is a cross-sectional view taken along plane B-B in FIG. 27.
Figure 30:
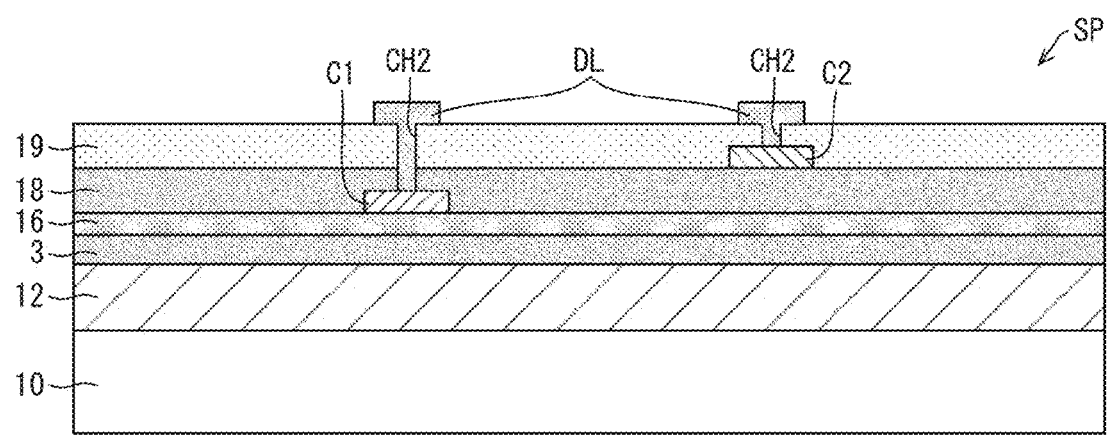
FIG. 30 is a cross-sectional view taken along plane C-C in FIG. 27.

FIG. 27 is a plan view showing a step to produce data signal lines DL of the frame region NA. FIG. 28 is a cross-sectional view taken along plane A-A in FIG. 27. FIG. 29 is a cross-sectional view taken along plane B-B in FIG. 27. FIG. 30 is a cross-sectional view taken along plane C-C in FIG. 27. Identical reference signs are used to denote identical or substantially identical constituent features throughout the drawings, and will not be elaborated upon here.

At Step S3$q$ previously shown in FIG. 4, a data signal line DL corresponding to the routed wire C1 is formed on the inorganic insulating film 19 to reach the routed wire C1 through the anti-electrolytic-corrosion contact hole CH1 and the connection-securing contact holes CH2 as illustrated in FIGS. 27, 28, and 30. After that, a data signal line DL corresponding to the routed wire C2 is formed on the inorganic insulating film 19 to reach the routed wire C2 through the anti-electrolytic-corrosion contact hole CH1 and the connection-securing contact holes CH2 as illustrated in FIGS. 27, 29, and 30.

Second Embodiment

Figure 31:
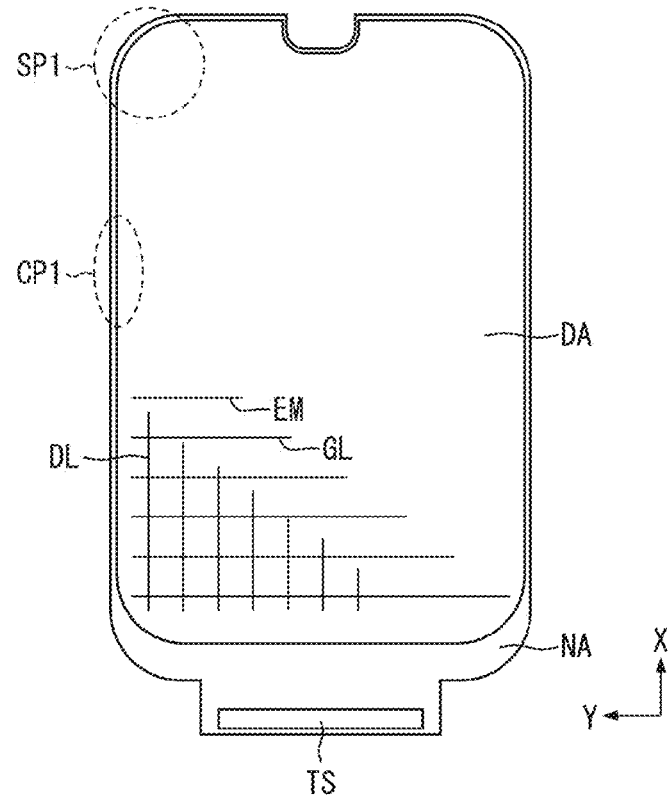
FIG. 31 is a plan view of a center portion and a corner portion of a display region according to a second embodiment.
Figure 32:
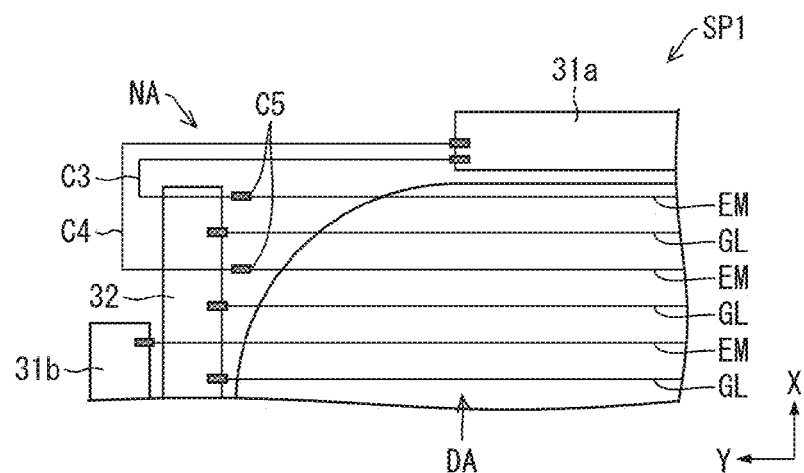
FIG. 32 is a plan view of a configuration of the corner portion of the display region according to the second embodiment.
Figure 33:
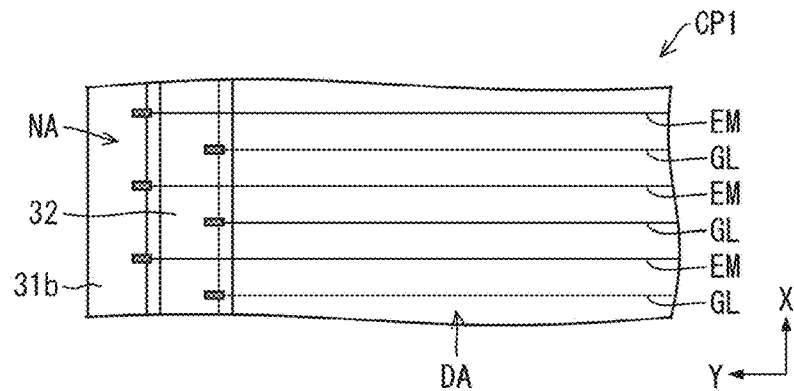
FIG. 33 is a plan view of a configuration of the center portion of the display region according to the second embodiment.
Figure 34:
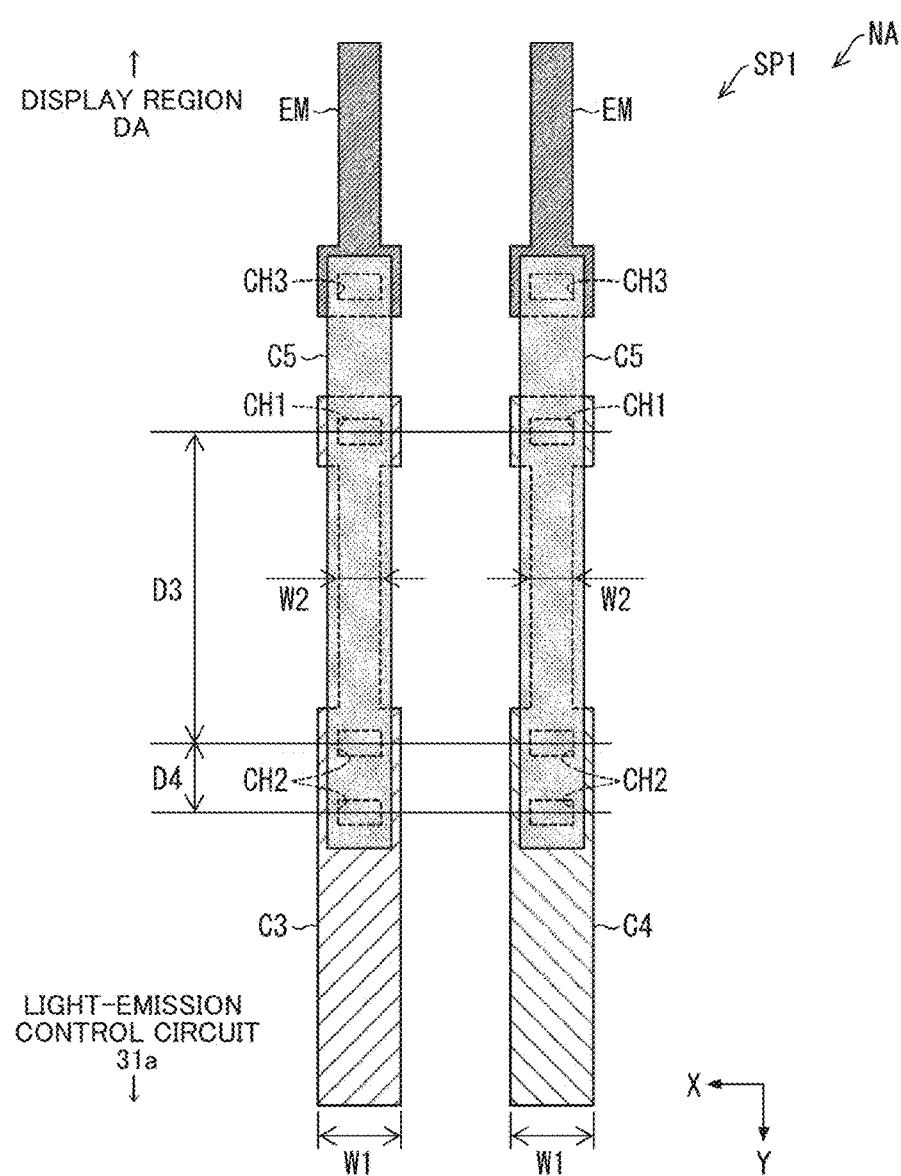
FIG. 34 is a plan view of a configuration of the corner portion of the frame region according to the second embodiment.
Figure 35:
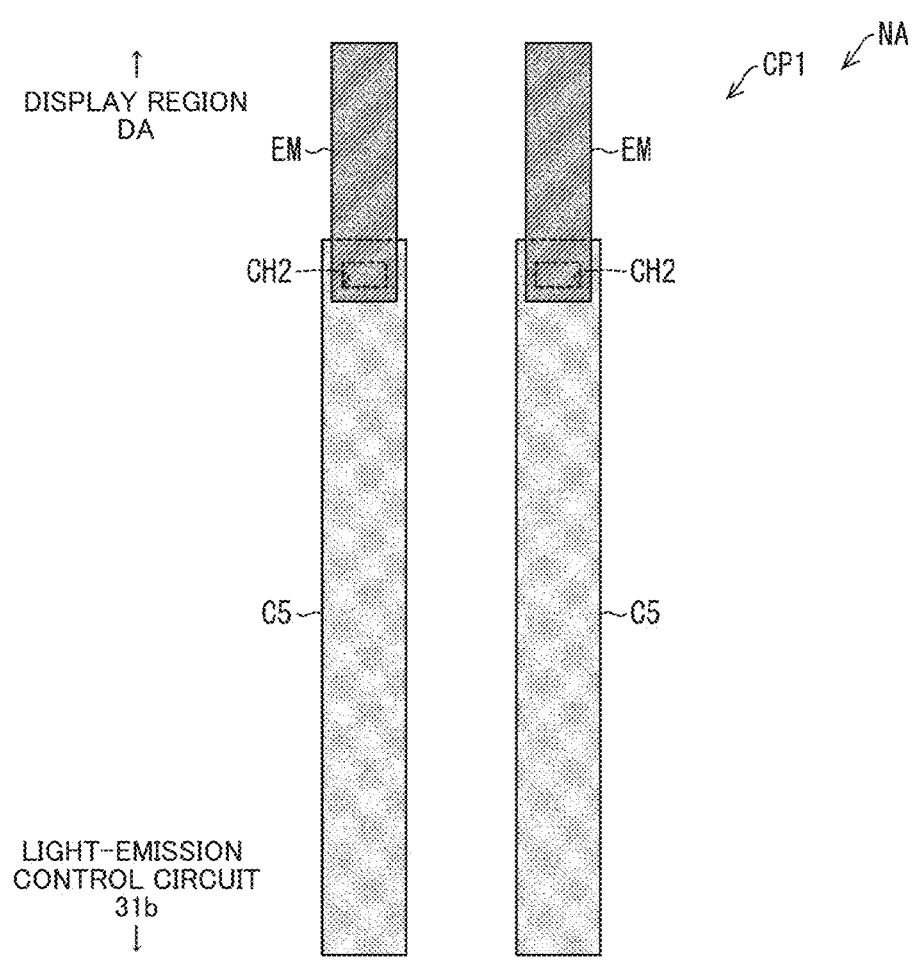
FIG. 35 is a plan view of a configuration of the center portion of the frame region according to the second embodiment.

FIG. 31 is a plan view of a center portion CP1 and a corner portion SP1 of the display region DA according to a second embodiment. FIG. 32 is a plan view of the corner portion SP1 of the display region DA. FIG. 33 is a plan view of the center portion CP1 of the display region DA. FIG. 34 is a plan view of a configuration of the corner portion SP1 of the frame region NA. FIG. 35 is a plan view of a configuration of the center portion CP1 of the frame region NA. Identical reference signs are used to denote identical or substantially identical constituent features throughout the drawings, and will not be elaborated upon here.

The display device according to the second embodiment includes: the display region DA; and the frame region NA disposed around the display region DA. The frame region NA includes the terminal unit TS disposed at an end of the display device. On the flexible substrate 12 disposed in the display region DA and the frame region NA, the first lower metal layer 4$ma$ (the first wire), the inorganic insulating film 18 (the first interlayer insulating film), the second lower metal layer 4$mb$ (the second wire), the inorganic insulating film 19 (the second interlayer insulating film), and the first upper metal layer 4$mc$ (the third wire) are provided in the stated order.

The display region DA includes: a plurality of light-emission control lines EM (control lines) and scan control lines GL (control lines) included in the first lower metal layer 4$ma$ and extending in the Y direction; a plurality of data signal lines DL extending in the X direction; a plurality of pixel circuits each provided to a corresponding one of intersections of (i) the light-emission control lines EM and the scan control lines GL and (ii) the data signal lines DL; and a plurality of light-emitting-element layers 5 each corresponding to one of the pixel circuits.

The frame region NA includes: a light-emission control circuit 31$a$ (a first driver, a control circuit) and a light-emission control circuit 31$b$ (a second driver, a control circuit) for inputting a light-emission control signal to the light-emission control lines EM; a scan control circuit 32 (the second driver, a control circuit) for inputting a scan control signal to the scan control lines GL; and a plurality of routed wires C3 and C4 for connecting the light-emission control lines EM and the light-emission control circuit 31$a$ together.

The light-emission control lines EM and the scan control lines GL are included in the first lower metal layer 4$ma$ (the first wire).

The first upper metal layer 4$mc$ (the third wire) includes a plurality of connection wires C5 connecting together the light-emission control lines EM and the routed wires C3 and C4.

FIG. 34 shows an example as follows. The routed wires C3 are included in the first lower metal layer 4$ma$ (the first wire). The routed wires C4 are included in the second lower metal layer 4$mb$ (the second wire). The routed wires C3 in the first lower metal layer 4$ma$ and the routed wires C4 in the second lower metal layer 4$mb$ are alternately routed. However, the disclosure shall not be limited to the above configuration. Both of the routed wires C3 and C4 may be included in the second lower metal layer 4$mb$ (the second wire).

Each of the light-emission control lines EM electrically connects to a corresponding one of the connection wires C5 through one or more contact holes CH3 (the first contact holes) provided to the inorganic insulating film 18 (the first interlayer insulating film) and the inorganic insulating film 19 (the second interlayer insulating film).

Each of the routed wires C3 and C4 is electrically connects to a corresponding one of the connection lines C5 through one or more anti-electrolytic-corrosion contact holes CH1 (the second contact holes) and connection-securing contact holes CH2 (the second contact holes) provided to the inorganic insulating film 19. Note that if the routed wires C4 are included in the first lower metal layer 4$ma$ (the first wire), the anti-electrolytic-corrosion contact holes CH1 are also provided to the inorganic insulating film 18.

A sum of the number of the anti-electrolytic-corrosion contact holes CH1 (the second contact holes) and the number of the connection-securing contact holes CH2 (the second contact holes), wherein the contact holes CH1 and CH2 correspond to the routed wires C3 and C4, is larger than, or equal to, the number of the contact holes CH3 (the first contact holes) each corresponding to one of the light-emission control lines EM.

For example, in FIG. 34, one anti-electrolytic-corrosion contact hole CH1 and two connection-securing contact holes CH2 correspond to each of the routed wires C3 and C4. One contact hole CH3 corresponds to each of the light-emission control lines EM. Such an example shows that the number of the second contact holes (the sum of the number of the anti-electrolytic-corrosion contact holes CH1 and the number of the connection-securing contact holes CH2 (three contact holes in total)) recited in claims is larger than the number of the first contact holes (the contact hole CH3 (one contact hole in total)) recited in the claims.

The number of the contact holes shall not be limited to the above numbers. The sum of the number of the anti-electrolytic-corrosion contact holes CH1 (the second contact holes) and the number of the connection-securing contact holes CH2 (the second contact holes) may be at least larger than, or equal to, the number of the contact holes CH3 (the first contact holes). For example, if one contact hole CH3 (the first contact hole) is provided, one or more anti-electrolytic-corrosion contact holes CH1 (the second contact holes) or connection-securing contact holes CH2 (the second contact holes) may be provided. Moreover, if no contact hole CH3 (the first contact hole) is provided, one or more anti-electrolytic-corrosion contact holes CH1 (the second contact holes) or connection-securing contact holes CH2 (the second contact holes) may be provided.

In the center portion CP1, the light-emission control lines EM do not have to be routed with the routed wires C3 and C4 to the light-emission control circuit 31a, as seen in the corner portion SP1. The light-emission control lines EM directly connect to the light-emission control circuit 31b. Hence, FIG. 35 illustrating the center portion CP1 shows the connection-securing contact holes CH2 (the second contact holes) alone for connecting light-emission control lines EM to connection wires C5.

The corner portion SP1 of the display region DA may be rounded. One or more of the light-emission control lines EM run through the corner portion SP1.

A control circuit includes: the light-emission control circuit 31a (the first driver) disposed along a side, of the display region DA, parallel with the Y direction; and the light-emission control circuit 31b (the second driver) disposed along a side, of the display region DA, parallel with the X direction; and the scan control circuit 32 (the second driver). The routed wires C3 and C4 are provided to connect together the light-emission control lines EM and the light-emission control circuit 31a (the first driver). Here, the first driver is a control circuit disposed along the side parallel with the Y direction. The second driver is a control circuit disposed along the side parallel with the X direction. In the above example, the first driver is the light-emission control circuit 31a. Alternatively, the first driver may be a scan control circuit 32a. That is, the control circuit may include: the scan control circuit 32a (the first driver) disposed along a side, of the display region DA, parallel with the Y direction; the scan control circuit 3sb (the second driver) disposed along a side, of the display region DA, parallel with the X direction; and the light-emission control circuit 32. In a modification of this configuration, the routed wires C3 and C4 are provided to connect the scan control lines GL to the scan control circuit 32a (the first driver).

The anti-electrolytic-corrosion contact holes CH1 are positioned farther away from the light-emission control circuit 31a than the connection-securing contact holes CH2 are.

The third distance D3 between an anti-electrolytic-corrosion contact hole CH1 and a connection-securing contact hole CH2 is preferably twice as great as, or greater than, the width W1 of each of the routed wires C3 and C4 provided with the anti-electrolytic-corrosion contact holes CH1. Moreover, the third distance D3 is preferably longer than the fourth distance D4 between the connection-securing contact holes CH2. Advantageous effects to be obtained are greater as the anti-electrolytic-corrosion contact holes CH1 and the connection-securing contact holes CH2 are farther spaced apart from each other, making it possible to keep the connection-securing contact holes CH2 from electrolytic corrosion developing in the anti-electrolytic-corrosion contact holes CH1.

The width W2, of each of the routed wires C3 and C4, between an anti-electrolytic-corrosion contact hole CH1 and a connection-securing contact hole CH2 is narrower than the width W1, of each of the routed wires C3 and C4, including connection-securing contact holes CH2.

Similar to the routed wires C1 and C2 described in the first embodiment, each of the routed wires C3 and C4 preferably bends at least two bending points between an anti-electrolytic-corrosion contact hole CH1 and a connection-securing contact hole CH2, and extends.

The connection-securing contact holes CH2 are preferably larger in number than the anti-electrolytic-corrosion contact holes CH1.

FIG. 31 shows that the corner portion SP1, included in the display region DA and provided across from the terminal unit TS, is rounded. In order to narrow a width of the frame region NA; that is, a non-display region in the rounded corner portion SP1, a light-emission control circuit; namely, the light-emission control circuit 31a, is disposed not close to the corner portion SP1 but along a side, of the display region DA, extending in the Y direction. In such a case, the routed wires C3 and C4, which are long and respectively formed of the first lower metal layer 4ma and the second lower metal layer 4mb, are routed to connect the light-emission control lines EM to the light-emission control circuit 31a. Such routed wires C3 and C4 are likely to develop electrolytic corrosion.

In the second embodiment, the anti-electrolytic-corrosion contact holes CH1 are positioned to the routed wires C3 and C4 at one end across from the light-emission control circuit 31a, and the connection-securing contact holes CH2 are positioned closer to the light-emission control circuit 31a away from the anti-electrolytic-corrosion contact holes CH1. Hence, even if the anti-electrolytic-corrosion contact holes CH1 develop electrolytic corrosion, the connection-securing contact holes CH2 can secure electrical connection between the light-emission control lines EM and the routed wires C3 and C4.

The disclosure shall not be limited to the embodiments described above, and can be modified in various manners within the scope of claims. The technical aspects disclosed in different embodiments are to be appropriately combined together to implement an other embodiment. Such an embodiment shall be included within the technical scope of the disclosure. Moreover, the technical aspects disclosed in each embodiment may be combined to achieve a new technical feature.

The invention claimed is:

1. A display device, comprising:
   a display region; and
   a frame region disposed around the display region, wherein
   the frame region includes a terminal unit disposed at an end of the frame region,
   on a substrate disposed in the display region and the frame region, a first wire, a first interlayer insulating film, a second wire, a second interlayer insulating film, and a third wire are provided in a stated order,
   the display region includes:
     a plurality of control lines included in the first wire and extending in a first direction;
     a plurality of data signal lines included in the third wire and extending in a second direction orthogonal to the first direction;
     a plurality of pixel circuits each provided to a corresponding one of intersections of the control lines and the data signal lines; and
     a plurality of light-emitting elements each corresponding to one of the pixel circuits,
   the frame region includes a plurality of routed wires to electrically connect together the data signal lines and a plurality of terminals included in the terminal unit,
   the routed wires electrically connect to the data signal lines through contact holes provided to the second interlayer insulating film,
   the display region includes: a pair of corner portions disposed in two corners of the display region, and provided closer to the terminal unit in the first direction; and a center portion disposed between the pair of the corner portions, the routed wires include: center portion routed wires; and
  corner portion routed wires longer than the center
  portion routed wires,
the corner portion routed wires are electrically connected
  to corresponding ones of the data signal lines by a first
  number of the contact holes,
the center portion routed wires are electrically connected
  to other corresponding ones of the data signal lines by
  a second number of the contact holes, the second
  number being smaller than the first number, and
a pair of the corner portion routed wires connected to the
  data signal lines by the first number of the contact holes
  are arranged side by side without any of the center
  portion routed wires connected to the data signal lines
  by the second number of the contact holes being
  located therebetween, and a pair of the center portion
  routed wires connected to the data signal lines by the
  second number of the contact holes are arranged side
  by side without any of the corner portion routed wires
  connected to the data signal lines by the first number of
  the contact holes being located therebetween.
2. The display device according to claim 1, wherein
the first wire includes the routed wires, and
the contact holes are provided to the second interlayer
  insulating film and the first interlayer insulating film.
3. The display device according to claim 2, wherein
the routed wires include: a routed wire included in the first
  wire; and an other routed wire included in the second
  wire and adjacent to the routed wire.
4. The display device according to claim 1, wherein
a first distance between one of the contact holes corresponding to one of the routed wires electrically connecting to one of the data signal lines running through
  one of the corner portions of the display region and an
  other one of the contact holes corresponding to an other
  one of the routed wire electrically connecting to an
  other one of data signal line running through an other
  one of the corner portions of the display region is
  longer than a second distance between one of the routed
  wires running in a routing region and provided closer to
  the one of the corner portions and an other one of the
  routed wires running in the routing region and provided
  closer to the other one of the corner portions, the
  routing region being provided between the terminal
  unit and the display region.
5. The display device according to claim 1, wherein
the corners of the display region are rounded.
6. The display device according to claim 1, wherein
two or more of the contact holes correspond to each of the
  corner portion routed wires,
the two or more of the contact holes include an anti-electrolytic-corrosion contact hole positioned farther
  away from the terminal unit than an other contact hole
  included in the two or more of the contact holes, and
the other contact hole included in the two or more of the
  contact holes is a connection-securing contact hole
  positioned closer to the terminal unit than the anti-electrolytic-corrosion contact hole.
7. The display device according to claim 1, wherein
a third distance between the anti-electrolytic-corrosion
  contact hole and the connection-securing contact hole
  is twice as great as, or greater than, a width of each of
  the routed wires provided with the anti-electrolytic-corrosion contact hole.
8. The display device according to claim 1, wherein
a width, of each of the routed wires, between the anti-electrolytic-corrosion contact hole and the connection-securing contact hole is narrower than the width of each
  of the routed wires including the connection-securing
  contact hole.
9. The display device according to claim 1, wherein
each of the routed wires bends at least two bending points
  between the anti-electrolytic-corrosion contact hole
  and the connection-securing contact hole, and extends.
10. The display device according to claim 1, wherein
a plurality of the connection-securing contact holes are
  larger in number than a plurality of the anti-electrolytic-corrosion contact holes.
11. A display device, comprising:
a display region; and
a frame region disposed around the display region,
  wherein
the frame region includes a terminal unit disposed at an
  end of the frame region,
on a substrate disposed in the display region and the frame
  region, a first wire, a first interlayer insulating film, a
  second wire, a second interlayer insulating film, and a
  third wire are provided in a stated order,
the display region includes:
  a plurality of control lines included in the first wire and
    extending in a first direction;
  a plurality of data signal lines extending in a second
    direction orthogonal to the first direction;
  a plurality of pixel circuits each provided to a corresponding one of intersections of the control lines and
    the data signal lines; and
  a plurality of light-emitting elements each corresponding to one of the pixel circuits,
the frame region includes:
  a control circuit for inputting a control signal to the
    control lines; and
  a plurality of routed wires for connecting the control
    lines and the control circuit,
the third wire includes a plurality of connection wires
  connecting together the control lines and the routed
  wires,
each of the control lines electrically connects to a corresponding one of the connection wires through a first
  contact hole provided to the first interlayer insulating
  film and the second interlayer insulating film,
each of the routed wires electrically connects to a corresponding one of the connection wires through a second
  contact hole provided to the second interlayer insulating film, and
a plurality of the second contact holes corresponding to
  each of the routed wire are larger in number than a
  plurality of the first contact holes corresponding to each
  of the control lines,
the second contact hole includes two or more second
  contact holes,
the two or more second contact holes include an anti-electrolytic-corrosion contact hole positioned farther
  away from the control circuit than an other contact hole
  included in the two or more second contact holes, and
the other contact hole included in the two or more second
  contact holes is a connection-securing contact hole
  positioned closer to the control circuit than the anti-electrolytic-corrosion contact hole.
12. The display device according to claim 11, wherein
the display region includes a corner portion that is
  rounded,
the control lines run through the corner,
the control circuit includes: a first driver disposed along a
  side, of the display region, parallel with the first direction; and a second driver disposed along a side, of the display region, parallel with the second direction, and
the routed wires connect together the control lines and the first driver.

13. The display device according to claim 12, wherein
the first wire includes the routed wires, and
the second contact hole is provided to the second interlayer insulating film and the first interlayer insulating film.

14. The display device according to claim 13, wherein
the routed wires include: a routed wire included in the first wire; and an other routed wire included in the second wire and adjacent to the routed wire.

15. The display device according to claim 11, wherein
the control circuit is a scan control circuit, and
the control lines are scan control lines.

16. The display device according to claim 11, wherein
the first wire includes the routed wires, and
the contact holes are provided to the second interlayer insulating film and the first interlayer insulating film.

17. The display device according to claim 16, wherein
the routed wires include: a routed wire included in the first wire; and an other routed wire included in the second wire and adjacent to the routed wire.

18. The display device according to claim 11, wherein
a first distance between one of the contact holes corresponding to one of the routed wires electrically connecting to one of the data signal lines running through one of the corner portions of the display region and an other one of the contact holes corresponding to an other one of the routed wire electrically connecting to an other one of data signal line running through an other one of the corner portions of the display region is longer than a second distance between one of the routed wires running in a routing region and provided closer to the one of the corner portions and an other one of the routed wires running in the routing region and provided closer to the other one of the corner portions, the routing region being provided between the terminal unit and the display region.

19. The display device according to claim 11, wherein
the corners of the display region are rounded.

20. A display device, comprising:
a display region; and
a frame region disposed around the display region, wherein
the frame region includes a terminal unit disposed at an end of the frame region,
on a substrate disposed in the display region and the frame region, a first wire, a first interlayer insulating film, a second wire, a second interlayer insulating film, and a third wire are provided in a stated order,
the display region includes:
a plurality of control lines included in the first wire and extending in a first direction;
a plurality of data signal lines included in the third wire and extending in a second direction orthogonal to the first direction;
a plurality of pixel circuits each provided to a corresponding one of intersections of the control lines and the data signal lines; and
a plurality of light-emitting elements each corresponding to one of the pixel circuits,
the frame region includes a plurality of routed wires to electrically connect together the data signal lines and a plurality of terminals included in the terminal unit,
the routed wires electrically connect to the data signal lines through contact holes provided to the second interlayer insulating film,
the display region includes: a pair of corner portions disposed in two corners of the display region, and provided closer to the terminal unit in the first direction; and a center portion disposed between the pair of the corner portions,
the routed wires include: center portion routed wires; and corner portion routed wires longer than the center portion routed wires,
the corner portion routed wires are electrically connected to data signal lines included in the data signal lines and running through the corner portions of the display region,
the center portion routed wires are electrically connected to data signal lines included in the data signal lines and running through the center portion of the display region,
the contact holes corresponding to the corner portion routed wires are larger in number than the contact holes corresponding to the center portion routed wires, wherein
two or more of the contact holes correspond to each of the corner portion routed wires,
the two or more of the contact holes include an anti-electrolytic-corrosion contact hole positioned farther away from the terminal unit than an other contact hole included in the two or more of the contact holes, and
the other contact hole included in the two or more of the contact holes is a connection-securing contact hole positioned closer to the terminal unit than the anti-electrolytic-corrosion contact hole.

* * * * *